United States Patent
Chowdhury et al.

(10) Patent No.: US 9,187,316 B2
(45) Date of Patent: Nov. 17, 2015

(54) ULTRASONIC SENSOR MICROARRAY AND METHOD OF MANUFACTURING SAME

(71) Applicant: UNIVERSITY OF WINDSOR, Windsor (CA)

(72) Inventors: Sazzadur Chowdhury, Windsor (CA); Aref Bakhtazad, London (CA)

(73) Assignee: UNIVERSITY OF WINDSOR, Windsor (CA)

( * ) Notice: Subject to any disclaimer, the term of this patent is extended or adjusted under 35 U.S.C. 154(b) by 0 days.

(21) Appl. No.: 14/331,295

(22) Filed: Jul. 15, 2014

(65) Prior Publication Data
US 2015/0044807 A1 Feb. 12, 2015

Related U.S. Application Data

(60) Provisional application No. 61/856,224, filed on Jul. 19, 2013.

(51) Int. Cl.
*H01L 21/00* (2006.01)
*B81C 1/00* (2006.01)

(52) U.S. Cl.
CPC ..... *B81C 1/00269* (2013.01); *H01L 2924/1461* (2013.01)

(58) Field of Classification Search
CPC ............................................... H01L 2924/1461
USPC .............................. 438/50, 51, 24, 25; 29/594
See application file for complete search history.

(56) References Cited

U.S. PATENT DOCUMENTS

| | | |
|---|---|---|
| 6,632,178 B1 | 10/2003 | Fraser |
| 6,942,750 B2 * | 9/2005 | Chou et al. ................ 156/272.2 |
| 7,152,481 B2 | 12/2006 | Wang |
| 7,545,012 B2 | 6/2009 | Smith et al. |
| 7,545,075 B2 | 6/2009 | Huang et al. |
| 7,612,483 B2 | 11/2009 | Degertekin |
| 7,670,290 B2 | 3/2010 | Hossack et al. |
| 7,781,238 B2 * | 8/2010 | Wodnicki et al. ............... 438/17 |
| 7,830,069 B2 | 11/2010 | Lukacs et al. |
| 7,839,722 B2 | 11/2010 | Wagner et al. |
| 7,892,176 B2 | 2/2011 | Wodnick et al. |

(Continued)

FOREIGN PATENT DOCUMENTS

| | | |
|---|---|---|
| WO | WO2009/001157 A1 | 12/2008 |
| WO | WO2012/075106 A1 | 6/2012 |
| WO | PCT/CA2013/00937 | 5/2015 |

OTHER PUBLICATIONS d) Design of a MEMS Discretlzed Hyperbolic Paraboloid Geometry Ultrasonic Sensor Microarray, IEEE Transactions on ultrasonic, ferroelectics and Frequency Control, vol. 55, No. 6, Jun. 2008.

Capacitive mlcromachined ultrasonic transducer (CMUT) arrays for medical imaging, Caronti et al., Microelectronics Journal, vol. 37, pp. 770-777, Dec. 13, 2005.

(Continued)

*Primary Examiner* — Reema Patel

(57) ABSTRACT

A sensor assembly including one or more capacitive micromachined ultrasonic transducer (CMUT) microarray modules which are provided with a number of individual transducers. The transducers include silicon device and backing layers joined by a fused benzocyclobutene (BCB) layer which defines the transducer air gap, and which are arranged to simulate or orient individual transducers in a hyperbolic paraboloid geometry. The transducers/sensor are arranged in a matrix and are activatable to emit and receive reflected beam signals at a frequency of between about 100 to 170 kHz.

25 Claims, 15 Drawing Sheets

(56) References Cited

U.S. PATENT DOCUMENTS

| | | |
|---|---|---|
| 7,923,795 B2 | 4/2011 | Kobayashi et al. |
| 9,035,532 B2 * | 5/2015 | Chowdhury .................. 310/300 |
| 2008/0315331 A1 | 12/2008 | Wodnicki |
| 2011/0025337 A1 | 2/2011 | Morrow et al. |
| 2011/0068654 A1 | 3/2011 | Cheng |
| 2011/0084570 A1 | 4/2011 | Soeda et al. |
| 2011/0163630 A1 | 7/2011 | Klootwijk et al. |
| 2012/0025337 A1 | 2/2012 | LeClair |
| 2014/0084747 A1 | 3/2014 | Lovera-Prieto et al. |

OTHER PUBLICATIONS

Abbas Syed, "A Non-planar CMUT array for Automotive Blind Spot Detection", University of Windsor, Electronic Theses and Dissertations, Chapters 3.1, 3.2, 4 and 5, 2009.

Meloche et al., "Design of a MEMS Discretized Hyperbolic Paraboloid Geometry Ultrasonic Sensor Microarray", IEEE Transactions on Ultrasonics, Ferroelectrics and Frequency Control, vol. 55, No. 8, Jun. 2008.

Zure et al. "Dynamic Analysis of an SOI based CMUT", IEEE ICIT 2012, Department of Electrical and Computer Engineering, University of Windsor, the entire document.

\* cited by examiner

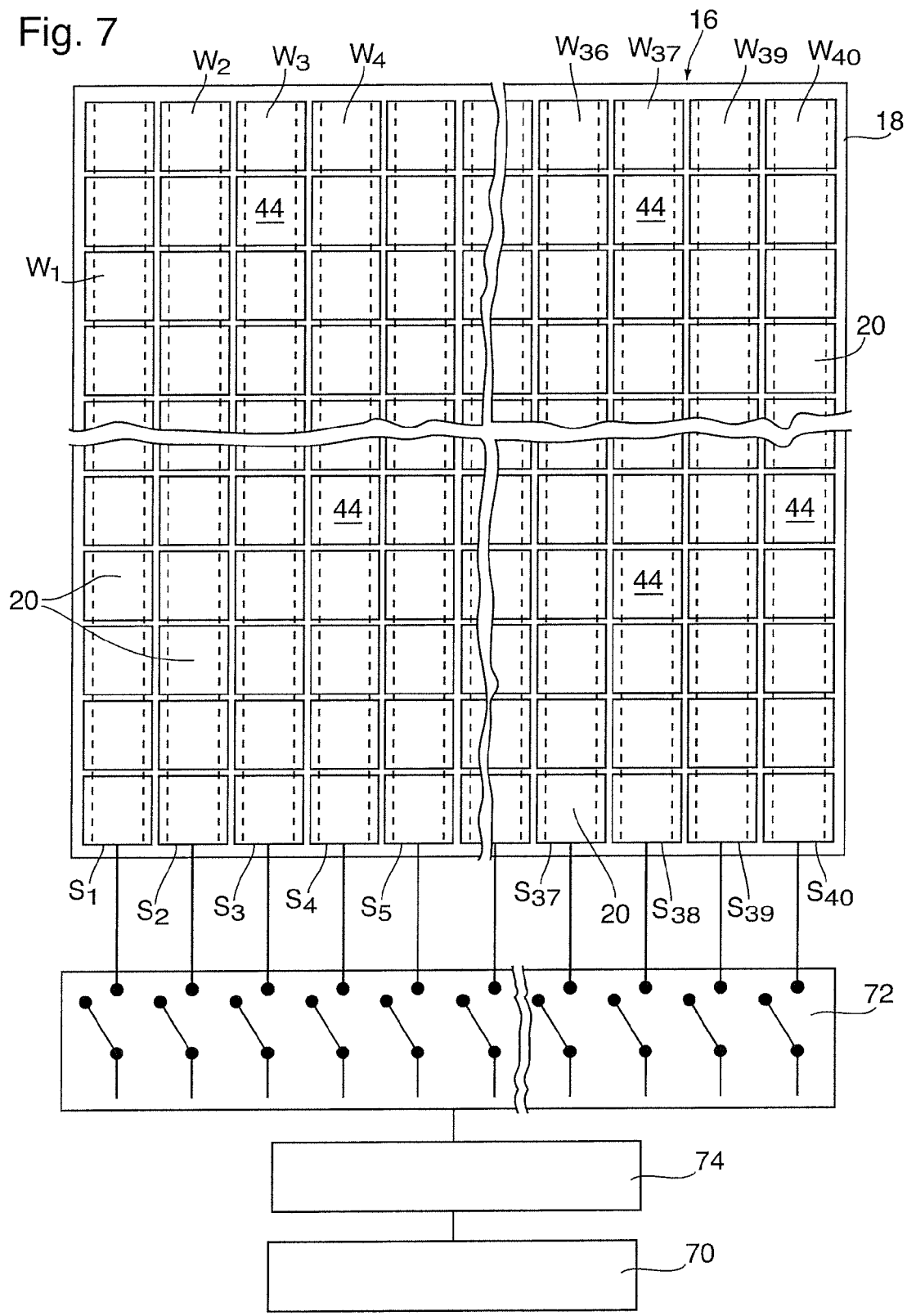

ULTRASONIC SENSOR MICROARRAY AND METHOD OF MANUFACTURING SAME

RELATED APPLICATIONS

This application claims priority and the benefit of 35 USC §119(e) to U.S. Patent Application Ser. No. 61/856,224, filed 19 Jul. 2013.

SCOPE OF THE INVENTION

The present invention relates to a microelectromechanical system (MEMS) and its method of manufacture, and more particularly three-dimensional MEMS devices such as sensor microarrays which may function as part of a capacitive micromachined ultrasonic transducer (CMUT). In a preferred application, the present invention relates to a method of manufacturing an ultrasonic sensor microarray which simulates a hyperbolic paraboloid shaped sensor configuration or chip, and which includes bonding partially cured benzocyclobutene (BCB) layers as a structural component. Suitable uses for the CMUT include non-vehicular and/or vehicle or automotive sensor applications, as for example in the monitoring of vehicle blind-spots, obstructions and/or in autonomous vehicle drive and/or parking applications.

BACKGROUND OF THE INVENTION

The publication *Design of a MEMS Discretized Hyperbolic Paraboloid Geometry Ultrasonic Sensor Microarray*, IEEE Transactions On Ultrasonics, Ferroelectrics, And Frequency Control, Vol. 55, No. 6, June 2008, the disclosure of which is hereby incorporated herein by reference, describes a concept of a discretized hyperbolic paraboloid geometry beam forming array of capacitive micromachined ultrasonic transducers (CMUT) which is assembled on a microfabricated tiered geometry.

In initial fabrication concepts for CMUTs, Silicon-on-Insulator (SOI) wafers were subjected to initial cleaning, after which a 10 nm seed layer of chromium is then deposited thereon using RF-magnetron sputtering to provide an adhesion layer. Following the deposition of the chromium adhesion layer, a 200 nm thick gold layer is deposited using conventional CMUT deposition processes. After gold layer deposition, a thin layer of AZ4620 photoresist is spin-deposited on the gold layer, patterned and etched. The gold layer is then etched by submerging the wafer in a potassium iodine solution, followed by etching of the chromium seed layer in a dilute aqua regia, and thereafter rinsing. The device layer is thereafter etched further to provide acoustical ports for static pressure equalization within the diaphragm, and allowing for $SiO_2$ removal during a release stage.

A top SOI wafer is etched using a Bosch process deep reactive ion etch (DRIE) in an inductively coupled plasma reactive ion etcher (ICP-RIE). After metal etching with the Bosch and DRIE etch, the remaining photoresist is removed by $O_2$ asking processing. The Bosch etched wafer is submerged in a buffer oxide etch (BOE) solution to selectively etch $SiO_2$ without significantly etching single crystal silicon to release the selective diaphragms. Following etching and rinsing, the sensing surfaces (dyes) for each of the arrays are assembled in a system-on-chip fabrication and bonded using conductive adhesive epoxy.

The applicant has appreciated however, existing processes for the fabrication of capacitive micromachined ultrasonic transducers require precise manufacturing tolerances. As a result, the production of arrays of CMUT sensors or transducers on a commercial scale has yet to receive widespread penetration in the marketplace.

U.S. Pat. No. 6,942,750 to Chou et al., the entirety of which is incorporated herein by reference, describes a construct and process of patterned wafer bonding using photosensitive benzocyclobutene (BCB) in the fabrication of a 3D MEMS construction. In particular, Chou et al. discloses the use of a light activated photosensitive BCB as an assembly adhesive used to effect precision patterning wafer bonding, with the resulting three-dimensional MEMS microstructure achieved with BCB adhesive layer adding to the Z-height of the assembled wafer complex.

SUMMARY OF THE INVENTION

The inventor has appreciated a new and/or more reliable CMUT array design may be achieved by improved manufacturing methods.

In one construction, the present invention provides a three-dimensional MEMS device, and more preferably a CMUT transducer, which incorporates a silicon wafer construct which incorporates benzocyclobutene (BCB) as a structural component in the Z-axis.

One embodiment of the invention provides a capacitive micromachined ultrasonic transducer (CMUT) based microarray module which incorporates a number of transducers. The microarray module is suitable for use in vehicle, as well as non-vehicle rail, aircraft and other sensor applications. For example the module may be provided as part of a hand or body position sensor, as well as in warning and/or control systems for monitoring blind-spots, adjacent obstructions and hazards, and/or in vehicle road position warning and/or autonomous drive applications.

Another embodiment of the invention provides a method for the manufacture of a CMUT based microarray of transducer/sensors, and more preferably CMUT based microarray modules, which are operable to emit signals over a number and/or range of frequencies, and which may be arranged to minimize frequency interference from adjacent sensors. In one possible preferred method of manufacture, benzocyclobutene (BCB) layer are brought together as an adhesive for bonding wafer constructs in the formation of a microarray.

It is envisioned that the invention may provide a simplified and reliable method of manufacturing CMUT microarray modules in an ultrasonic sensor manufacturing process, in which multiple CMUT microarrays modules may be more easily provided either in a hyperboloid parabolic geometry using a molding, stamping or three dimensional (3D) printing process; or which simulates such a configuration.

In another possible embodiment, the present invention provides a sensor assembly which is provided with one or more capacitive micromachined ultrasonic transducer (CMUT) microarrays modules which are provided with a number of individual transducers. In one possible final sensor construction, the CMUT microarray modules are arranged so as to simulate or orient individual transducers in a generally hyperbolic paraboloid geometry, however, other module arrangements and geometries are possible.

Preferably, the sensor assembly includes at least one CMUT microarray module which incorporates a number of individual transducer/sensors, and which are activatable individually, selectively or collectively to emit and receive reflected signals. Most preferably in the assembly of the wafer construct, BCB is applied to opposing surfaces of adjacent silicon or other wafers which are to be joined, and semi-cured to achieve BCB-wafer to BCB-wafer surface adherence. In a most preferred mode of assembly, the BCB layers are reduced and/or thinned using a suitable thinner such as Mesitylene (1,3,5-trimethylbenzene). The thinned BCB resin may be spin deposited to create a desired thickness build up having regard to the final Z-height of the wafer construct to be achieved. The applicant has appreciated that the present method allows for final curing of the BCB layers at lower temperatures and/or over long time intervals operate to reduce heat stress to the assembled wafer construct.

Different sized sensors with different numbers of microarray modules and beamwidths, and/or CMUT microarray modules containing greater numbers of individual transducer/sensors may be provided. Depending on the application, the individual transducer/sensors may exceed hundreds or thousands in numbers, having regard upon the overall sensor assembly size, the intended use and component requirements.

In one construction, the microarray modules are mounted to a backing in a substantially flat geometry, and which preferably has a curvature of less than ±10°, and more preferably less than ±1°. Whilst sensor assemblies may include as few as a single microarray module, more preferably multiple CMUT microarray modules are provided, and which are arranged in a square matrix module arrangement of 9×9 or greater. Optionally, individual CMUT microarray modules may be formed as a generally flexible sheet which allows for free-form shaping, to permit a greater range of output beam shape and/or configurations.

Each microarray module itself is preferably provided with at least a 5×5, and preferably a 40×40, or greater sensor array of individual CMUT transducer/sensors. The transducer/sensors in each microarray module themselves may also be subdivided.

Accordingly, there are provided a number of non-limiting aspects of the invention and which include:

1. A method of forming a capacitive micromachined transducers (CMUT) microarray comprising a plurality of transducers, providing a first silicon wafer having generally planar, parallel top and bottom surfaces, said first wafer having a thickness selected at upto 700 microns and preferably between about 400 and 500 microns; applying an adhesion promoter layer on the wafer and then coating a BCB layer thereon; after partially curing the BCB layer, and preferably partially curing by soft baking at 80° C. to 150° C. for upto 5 minutes, photo-plasma etching a top surface of the BCB layer to form a plurality of pockets therein. which preferably have common geometric shape, and are characterized by a respective sidewall extending generally normal to said top surface and extending to a depth of upto 20 microns and preferably between about 0.2 and 5.0 microns. A second wafer having a partially cured BCB layer thereon is then sealed over the top of the etched BCB surface to substantially seal each pocket as a transducers air gap. The BCB layers are then fully cured and fused to each other, as for example, by heating at more than 175° C., preferably more than 200° C., and most preferably more than 240° C. A conductive metal layer is then applied to at least part of at least one of the bottom surface of the first wafer and the top surface of the second wafer.

2. A method of manufacturing a capacitive micromachined ultrasonic transducers (CMUT) based assembly sensor, said method comprising, providing a sensor backing platform, said backing platform including a generally square mounting surface having a width selected at between about 0.5 and 10 cm, providing a plurality CMUT transducer microarrays modules comprising a plurality of transducers, each microarray modules having a generally geometric shape and having an average width of upto 4 cm and preferably between about 1 mm and 10 mm, said microarray being formed by providing a first silicon wafer construct comprising a generally planar, silicon wafer having generally parallel top and bottom surfaces and a partially cured BCB layer, said silicon wafer having a thickness selected at upto 750 microns and preferably between about 400 and 500 microns, said partially cured BCB layer having a thickness selected at upto 1000 nm, and preferably about 900 nm and defining a plurality of pockets therein. Providing a second wafer construct having a silicon wafer with a thickness of upto 100 microns, preferably upto 20 microns, and most preferably, between about 0.2 and 5 microns, and which further includes upto a 75 micron thick and preferably a 0.2 and 2 micron thick partially cured BCB adhesive layer thereon. The partially cured BCB layer of the second wafer is positioned over the BCB layer of the first wafer construct to seal each said pocket as a respective transducer air gap and provide substantially contiguous seal therebetween, and the BCB resins are thereafter fully cured, bonding to each other. Optionally, a first conductive metal layer is applied to at least part of at least one of the bottom surface of the first wafer construct and the top surface of the second wafer construct, and a second conductive metal layer is optionally applied to either the mounting surface or the one of the bottom surface of the first wafer and the top surface of the second wafer construct without the first conductive metal layer, and the one of the bottom surface of the first wafer and the top surface of the second wafer without the first conductive metal layer is mounted on said mounting surface.

3. A method of forming a capacitive micromachined transducers (CMUT) for use in a microarray having a plurality of transducers, said method comprising, providing a first silicon-based wafer having generally planar upper and lower surfaces, forming a first partially cured benzocyclobutene (BCB) layer over one of said upper or lower surfaces, providing a second silicon-based wafer as a device layer, said device layer having generally planar, parallel top and bottom surfaces, said device layer having thickness selected at between about 0.05 and 20 microns, forming a second partially cured benzocyclobutene (BCB) layer over one of said top or bottom surface of said device layer, etching a surface of one of said first and second BCB layers to form an etched surface having a plurality of pockets therein, each of said pockets having a preselected geometric shape, said pockets being characterized by respective sidewalls extending to a depth of between about 0.1 and 15 microns, aligning a portion of the etched surface of the BCB layer and the other of the first and second BCB layers in substantially juxtaposed contact, fully curing the first and second BCB layers to bond and said first wafer to said device layer with said bonded first and second BCB layers interposed therebetween, whereby said pockets form respective transducer air gaps.

4. A method of forming a capacitive micromachined transducer for use in a microarray comprising a plurality of transducers, said method comprising, providing a silicon backing wafer having generally planar, parallel front and rear surfaces, said backing wafer having a thickness selected at between about 5 and 100 microns, forming a first partially cured benzocyclobutene (BCB) layer over said front surface, said first BCB layer having a thickness selected at less than about 15 microns, providing a device layer having generally planar, parallel opposing forward and rearward surfaces, said device layer having a thickness selected at between about 0.05 and 15 microns, forming a second partially cured BCB structural layer over a rearward surface of said device layer, said BCB structural layer having a thickness selected at between about 1 and 15 microns, photo-plasma etching said second partially cured BCB structural layer to form a plurality of pockets therein, said pockets being characterized by a respective sidewall extending generally normal to said rearward surface and extending to a depth of between about 0.1 and 10 microns, with the first BCB layer and second BCB layer in juxtaposed contact, fully curing the first BCB layer and second BCB layer to bond the front surface of the silicon backing wafer in general alignment with the rearward surface of the device layer and substantially seal each pocket as a respective transducer air gap, and wherein said device layer is bonded relative to the silicon backing wafer with the bonded first BCB layer and second BCB layers as a structural and adhesive component, applying a conductive metal layer to at least part of at least one of the rear surface of the silicon backing wafer and the forward surface of the device layer.

A method and/or sensor system according to any of the preceding aspects, wherein a adhesion promoter layer is applied to the silicon wafer of the first wafer construct prior to forming the BCB adhesive layer thereon in a thickness selected at upto 100 nm, and preferably between about 10 and 50 nanometers.

A method and/or sensor system according to any of the preceding aspects, wherein BCB adhesive layers thinned with Mesitylene, or other suitable thinner, are applied to one of the silicon wafers of the first or second wafer constructs as a structural layer in a thickness selected at upto 4 µm, preferably between about 0.5 and 2 µm, and most preferably at about 900 nm.

A method and/or sensor system according to any of the preceding aspects, wherein the first silicon-based wafer comprises a silicon wafer having thickness selected at upto about 500 microns, and preferably between about 100 and 400 microns.

A method and/or sensor system according to any of the preceding aspects, wherein the second silicon wafer construct comprises a silicon-on-insulator wafer including a silicon device layer, and further includes an oxide layer and a silicon handle layer, the silicon device layer being removably mounted on the oxide layer.

A method and/or sensor system according to any of the preceding aspects, comprising photo-plasma etching said pockets in at least one of said partially cured BCB layers.

A method and/or sensor system according to any of the preceding aspects, further comprising physically sectioning the bonded first and second wafers into individual microarrays, said microarrays comprising a square matrix of nine-by-nine transducers or greater.

A method and/or sensor system according to any of the preceding aspects, wherein the step of applying the conductive metal comprises applying to at least part of said first or second silicon wafer a layer of a metal selected from the group consisting of gold, silver and copper, wherein said conductive metal layer has a thickness selected at between about 50 and 500 nanometers, and preferably about 100 nanometers.

A method and/or sensor system according to any of the preceding aspects, wherein said geometric shape comprises a generally square shape having a lateral dimension selected at between about 15 and 200 microns.

A method and/or sensor system according to any of the preceding aspects, wherein said step of forming said pockets comprises forming said pockets in a generally square matrix, wherein groupings of said pockets are aligned in a plurality parallel rows and/or columns.

A method and/or sensor system according to any of the preceding aspects, wherein said step of applying said BCB layer comprises coating BCB resin to a bottom of the silicon wafer of the second wafer construct, said BCB layer having a thickness selected at upto 50 microns, and preferably between about 0.5 and 4 microns, and most preferably about 0.8 microns, and prior to full curing positioning said BCB layer in a juxtaposed contact with the top surface of the BCB layer of the first wafer construct.

A method and/or sensor system according to any of the preceding aspects, wherein said step of forming said pockets comprises forming a square array of at least one hundred pockets, and preferably at least five hundred, each of said pockets having a generally flat bottom.

A method and/or sensor system according to any of the preceding aspects, further wherein prior to coating said BCB layer thereon, mounting said second silicon wafer to a handle wafer, and grinding said silicon wafer to a desired thickness as a device layer.

A method and/or sensor system according to any of the preceding aspects, wherein said step of mounting comprises mounting said CMUT transducer microarray modules to said backing platform in a generally square array.

A method and/or sensor system according to any of the preceding aspects, further comprising forming said backing platform from acrylonitrile butadiene styrene (ABS) having a generally flat module mounting surface. In an alternative aspect, the forming step comprises forming said backing platform on the three-dimensional printer A method and/or sensor system according to any of the preceding aspects, further comprising forming said backing platform with a discretized hyperbolic paraboloid mounting surface, said hyperboloid paraboloid mounting surface including a plurality of discrete planar surfaces for receiving an associated one of said microarray modules thereon, and further mounting said CMUT transducer microarray modules on the associated ones of said planar surfaces.

A method and/or sensor system according to any of the preceding aspects, wherein the step of applying the first metal conductive layer comprises spin coating on at least one silicon wafer, a layer of a metal selected from the group consisting of gold, silver, and copper, wherein said first conductive metal layer has a thickness selected at between about 100 and 500 nanometers, and preferably about 100 nanometers.

A method and/or sensor system according to any of the preceding aspects, wherein said step of etching said pockets comprises after partial curing plasma etching said pockets in said BCB layer in a generally square or rectangular matrix orientation, wherein said transducers in each microarray module are aligned in a plurality parallel rows and columns.

A method and/or sensor system according to any of the preceding aspects, wherein said step of applying said first conductive metal layer comprises coating substantially the entirety of the bottom of the silicon wafer of the first wafer construct or the top of the silicon wafer of the second wafer construct, and wherein after coating; selectively removing portions of said first conductive metal layer.

A method and/or sensor system according to any of the preceding aspects, wherein the CMUT is operable to output a transmitted beam at a frequency selected at between about 150 and 163 kHz.

BRIEF DESCRIPTION OF THE DRAWINGS

Reference may be had to the following detailed description taken together with the accompanying drawings, in which:

FIG. 7 illustrates schematically an enlarged view of an individual CMUT microarray module used in the ultrasonic sensor array of FIG. 6;

DETAILED DESCRIPTION OF THE PREFERRED EMBODIMENTS

Figure 1:
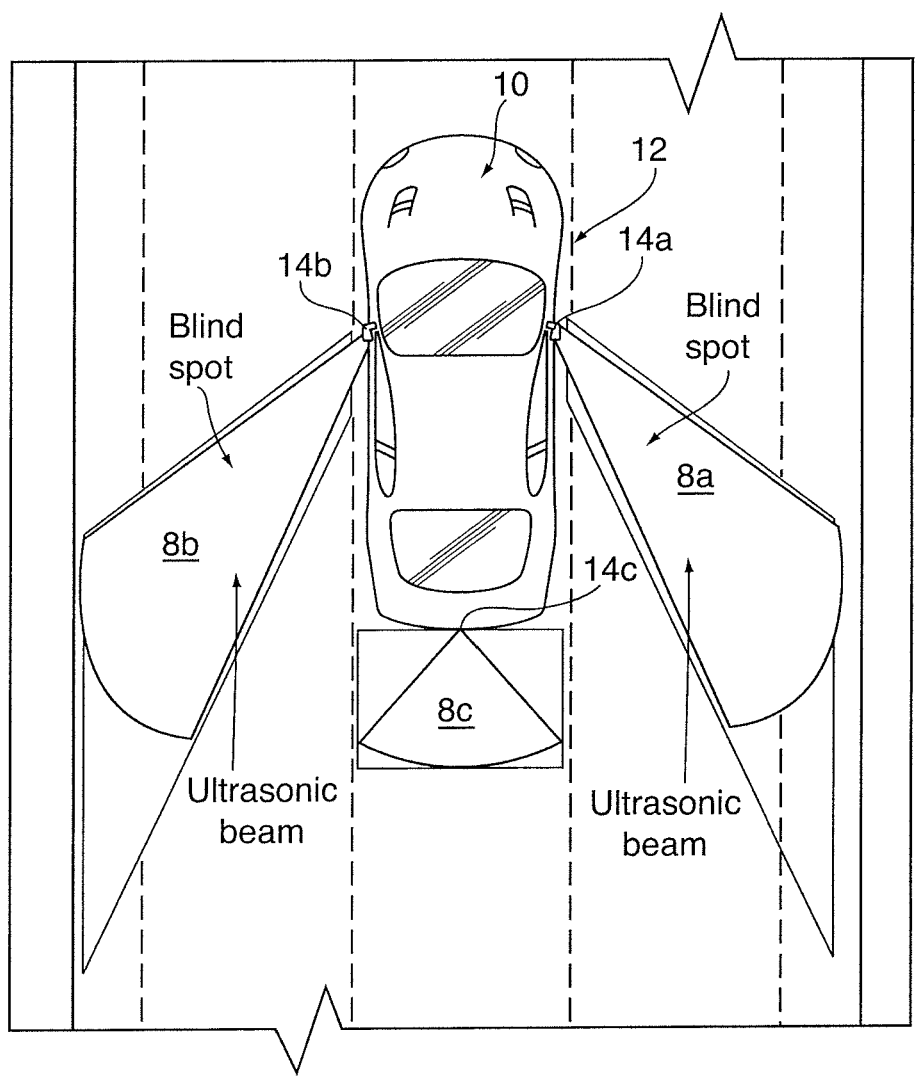
FIG. 1 shows schematically an automobile illustrating the placement of CMUT based ultrasonic sensor assemblies therein, and their desired coverage area, as part of a vehicle safety monitoring system for monitoring vehicle blind-spots.

In accordance with a most preferred process, benzocyclobutene is provided as both a structural component and adhesive used in the bonding of one or more silicon and silicon-on-insulator (SOI) (shown as 20 in FIG. 5) wafers in the manufacture of MEMS devices, and most preferably CMUT transducers. Most preferably the CMUT transducer 20 is provided as part of a series of individual CMUT transducers which are arranged in an array, and preferably at least a 6×6 array, preferably at least a 10×10 array, and more preferably approximately 40×40 square array configuration.

As will be described, the transducers 20 may operate with suitable frequency ranges may be as low as 40 kHz. In vehicle applications, more preferably the transducer/sensor of each microarray is operable at frequencies of at least 100 kHz, and most preferably at about 150 kHz to minimize the effects of air damping. In a preferred construction, the sensor assembly is provided for operation as vehicle blind-spot sensor.

As shown with respect to the attached Figures, in the construction of the array a SOI wafer is bonded to a next silicon wafer using BCB as an adhesive and structural layer to provide a desired Z-height dimension. In a most preferred process, BCB resin layers are applied separately to both the SOI wafer and silicon wafer and partially cured, following which the BCB layers are brought into juxtaposition and thereafter fully cured at reduced temperatures. In a most preferred process of manufacture Cyclotene™ 3022-46, manufactured by DOW, is selected as the BCB resin for use in the present invention. The BCB is preferably diluted or thinned with mesitylene, or other suitable solvents, to achieve more consistent and controllable flowing properties during wafer application, as for example, by spin deposition. In test manufacturing, both partial curing and full curing of the deposited BCB resin layers was achieved using maximum temperatures well below the maximum temperatures recommended by the manufacturer as shown in the following Table 1:

TABLE 1

| Lapsed Time Hours:minutes | Partial Cure | | Full Cure | |
| --- | --- | --- | --- | --- |
| | Actual Temperatures ° C. | Recommended* Temperatures ° C. | Actual Temperatures ° C. | Recommended* Temperatures ° C. |
| 0:0 | 20 | 20 | 20 | 20 |
| 0:15 | 52 | 100 | 52 | 100 |
| 0:30 | 85 | 100 | 85 | 150 |
| 0:45 | 117 | 150 | 117 | 150 |
| 1:00 | 150 | 150 | 150 | 175 |
| 1:15 | 150 | 165 | 150 | 200 |
| 1:30 | 150 | 180 | 150 | 225 |
| 1:45 | 170 | 195 | 165 | 250 |
| 2:00 | 190 | 210 | 180 | 250 |
| 2:15 | 190 | 210 | 195 | 250 |
| 2:30 | 190 | 210 | 210 | 250 |
| 2:45 | 190 | 210 | 210 | 250 |
| 3:00 | 190 | 210 | 210 | 230 |
| 3:25 | 150 | 180 | 210 | 210 |
| 3:30 | 130 | 150 | 210 | 190 |
| 3:45 | 110 | 120 | 190 | 170 |

TABLE 1-continued

| Lapsed Time Hours:minutes | Partial Cure | | Full Cure | |
|---|---|---|---|---|
| | Actual Temperatures ° C. | Recommended* Temperatures ° C. | Actual Temperatures ° C. | Recommended* Temperatures ° C. |
| 4:25 | 90 | 90 | 170 | 150 |
| 4:50 | 70 | 60 | 150 | 130 |

*Note:
Recommended temperatures and times are those suggested by DOW; with actual temperature and times reflecting experimental temperature curves that have been shown in testing in the process with good results.

(i) 5×5 Array

Reference may be had to FIG. 1 which illustrates schematically a vehicle 10 having an ultrasonic based obstruction monitoring system 12 in accordance with a first embodiment. The monitoring system 12 incorporates a series of ultrasonic sensors assemblies 14a,14b,14c which are each operable to emit and receive ultrasonic beam signals across a respective vehicle blind-spot or area of concern 8a,8b,8c, to detect adjacent vehicles and/or nearby obstructions, or encroachments in protected areas.

Figure 2:
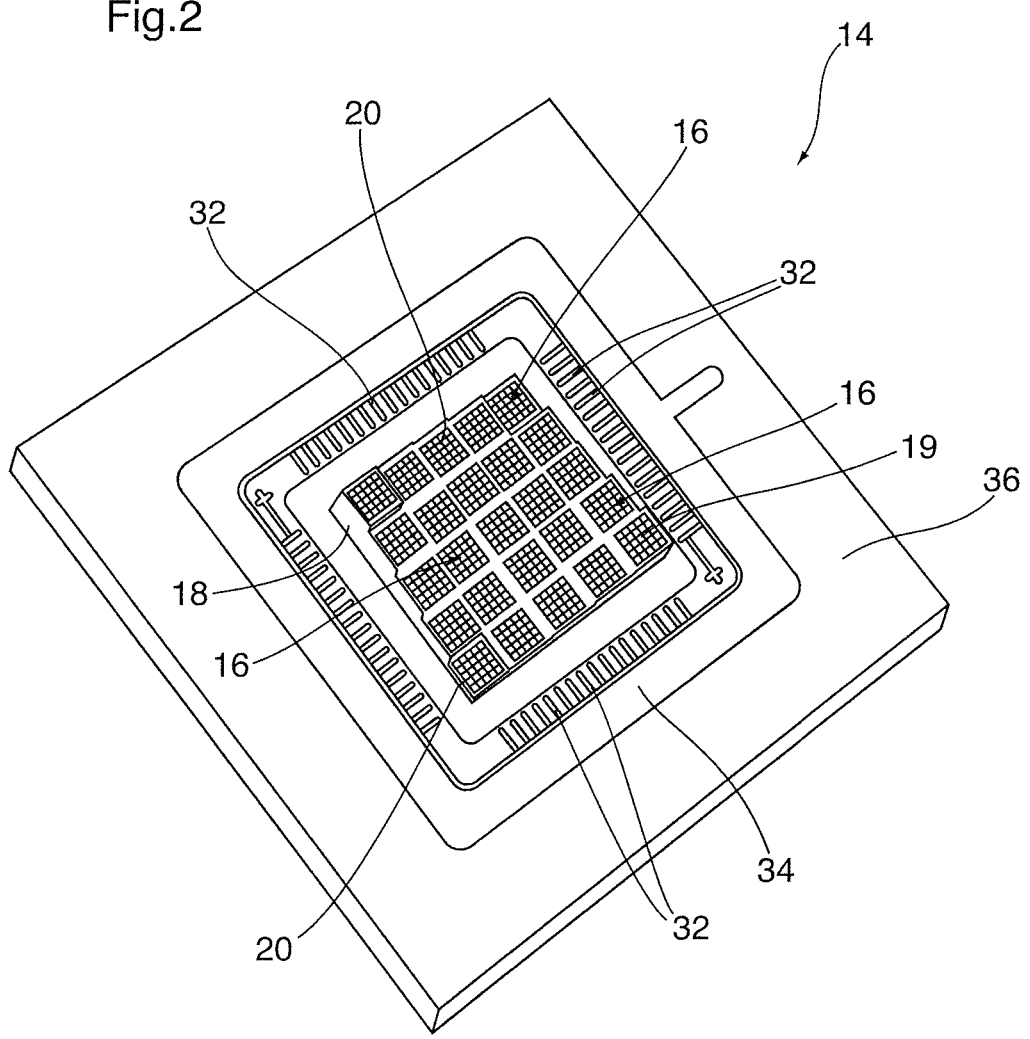
FIG. 2 illustrates an ultrasonic sensor assembly which includes a 5×5 construct of CMUT microarray modules used in the monitoring system of FIG. 1, in accordance with a first embodiment of the invention.
Figure 3:
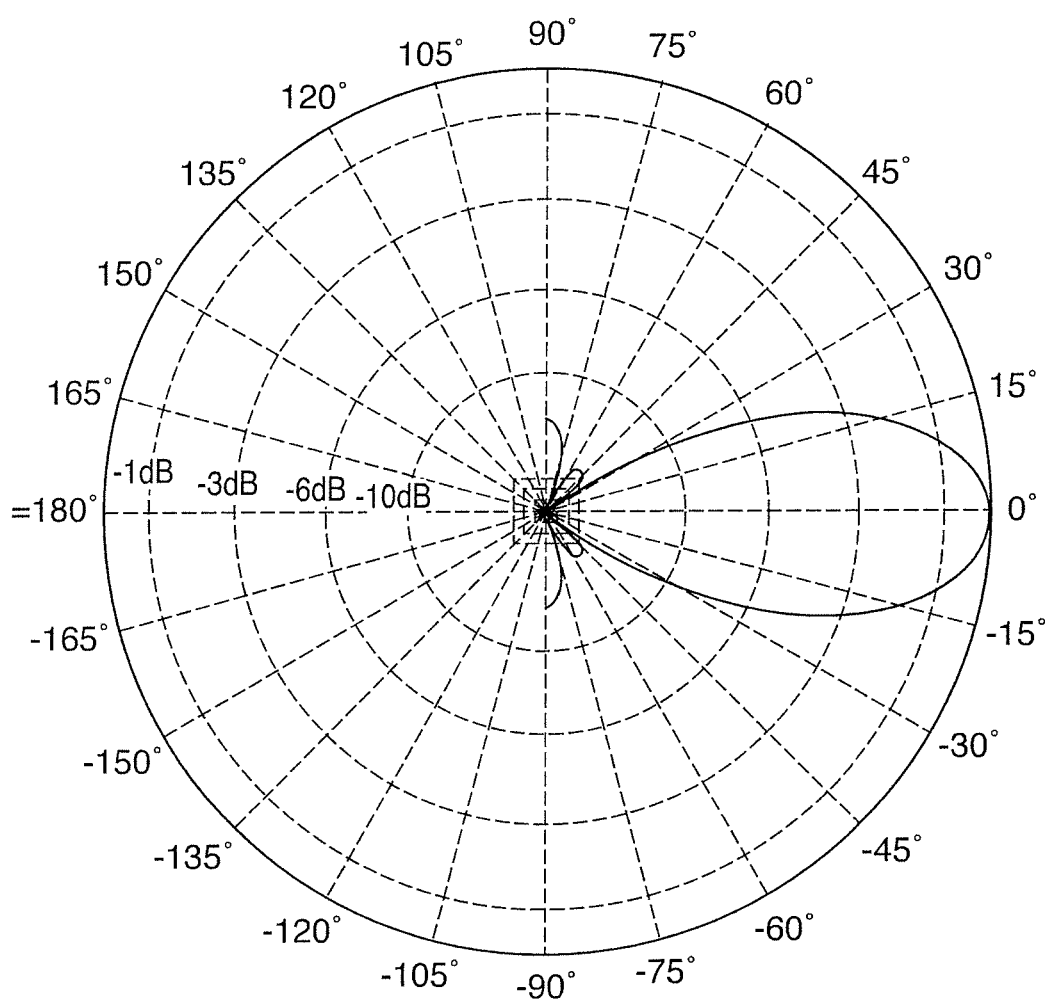
FIG. 3 illustrates a polar plot of the beam output geometry of the 5×5 construct of CMUT microarray module shown in FIG. 2.

Each sensor assembly 14 is shown best in FIG. 2 as incorporating an array of twenty-five identical capacitive micromachined ultrasonic transducer (CMUT) microarray modules 16. As will be described, the microarray modules 16 are mounted on a three-dimensional base or backing platform 18, with the forward face or surfaces 19 of the microarray modules 16 oriented in a generally hyperbolic paraboloid geometry. FIG. 2 shows best each of the CMUT microarray modules 16 in turn, as formed from thirty-six individual CMUT transducer/sensors 20 (hereinafter also transducers) which in operation output and receive a generally elongated ultrasonic signal beam (FIG. 3). In one embodiment, transducers 20 are positioned within a 6×6 (not shown to scale) rectangular or square matrix or grid arrangement within the individual microarray module 16.

Figure 4:
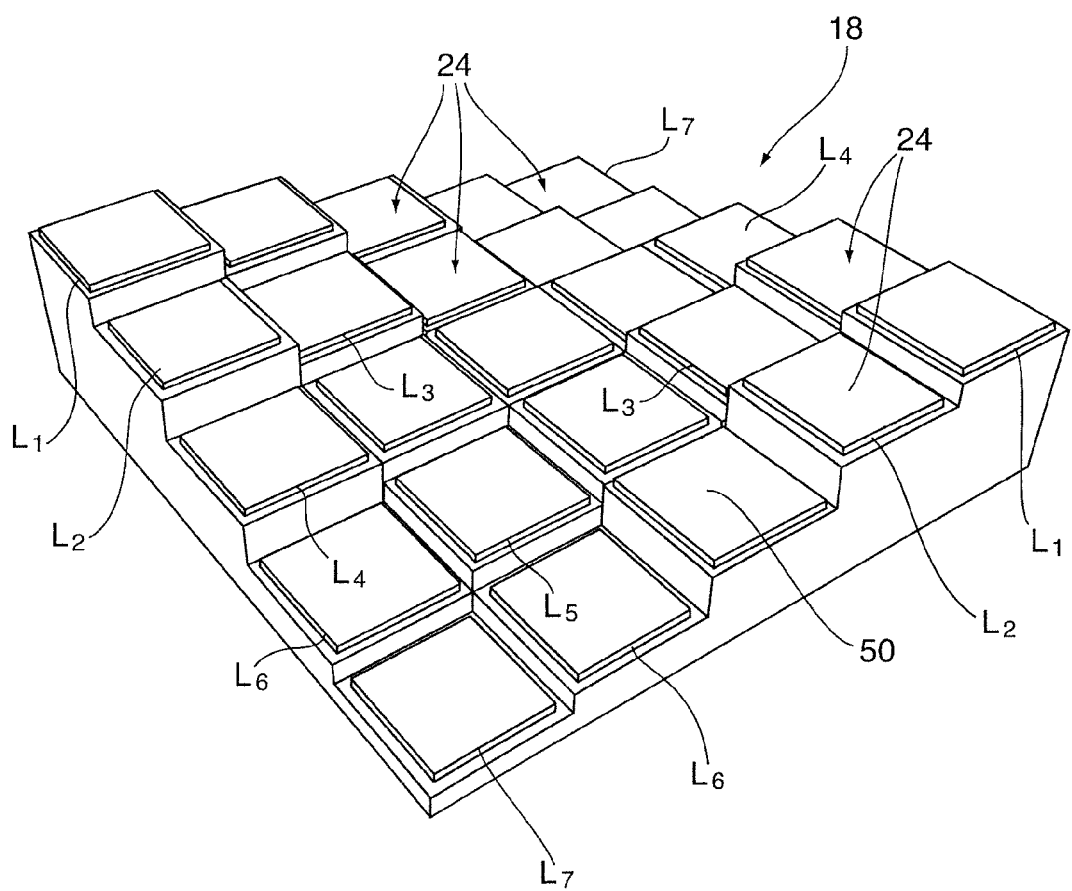
FIG. 4 illustrates a sensor backing platform for the 5×5 construct showing the twenty-five CMUT microarray module elevations used to approximate hyperbolic paraboloid surface.

FIG. 4 shows best, the three-dimensional backing platform 18 as constructed as having a number of module mounting surfaces 24 which are positioned at selected levels $L_1$, $L_2$, ... $L_n$ relative to each other in a discretized generally hyperbolic paraboloid shape selected to simulate the generally continuous curving hyperbolic paraboloid curvature. In simplified form of manufacture, the backing platform 18 is formed as a three-dimensional plastic or silicon backing which presents twenty-five separate discrete planar square mounting surfaces 24. Each mounting surface 24 has a co-planar construction and a complimentary size selected to receive and support an associated CMUT microarray module 16 thereon. In this manner, the CMUT microarray modules 16 are themselves mounted on the three-dimensional backing platform 18, with the raised geometry of the mounting surfaces 24 orienting the array of microarrays 16 in the desired generally discretized hyperbolic paraboloid geometry. The backing platform 18 is provided with an electrically conductive gold or copper top face coating layer 50 which functions as a common ground layer for each module transducer 20. The backing layer 18 in turn is electrically gold bonded to suitable pin connectors 32 (FIG. 2) used to mount the pin base 34 as the sensor chip 36 used in each sensor assembly 14a, 14b, 14c.

The applicant has appreciated that by varying the curvature simulated by the relative positioning of the mounting surfaces 24 in different hyperbolic paraboloid configurations, it is possible to vary the output beam geometry of the sensor chip 36, to tailor it to a desired application. By way of example, where the sensor assembly 14 is used as backup vehicle sensor 14c (FIG. 1), the backing platform 18 may be provided with a flatter hyperbolic paraboloid curvature selected to produce comparatively wider, shorter beam signals. In contrast, sensor assemblies 14a,14b may be provided with a backing platform 18 having a relatively higher degree of curvature, to output narrower, longer beam signals.

In a most simplified construction, the 6×6 array of individual transducers 20 within each CMUT microarray module 16 present a generally planar forward surface 19 (FIG. 2) which functions as a signal emitter/receptor surface for the generated ultrasonic signals. In use, the individual transducers 20 are electronically activated to emit and then receive ultrasonic beam signals which are reflected by nearby vehicles and/or obstructions. In this manner, depending on the timing between signal emission, reflection and reception and/or the intensity of the reflected ultrasonic signals which are detected by each microarray module 16, the monitoring system 12 may be used to provide either an obstruction warning, or in case of auto-drive applications, control the vehicle operation speed and/or direction.

In the construction of each ultrasonic sensors assembly 14, each CMUT microarray module 16 used in the monitoring system 12 preferably is formed having a footprint area of about 1 to 5 mm², and a height of about 0.5 to 2 mm. In the 5×5 matrix arrangement shown in FIG. 2, the sensor chip 36 thus houses 900 individual transducers 20 in twenty-five microarray groupings of thirty-six, at seven discrete elevation levels, L1-7 (FIG. 4), in the 5×5 matrix distribution.

Figure 5:
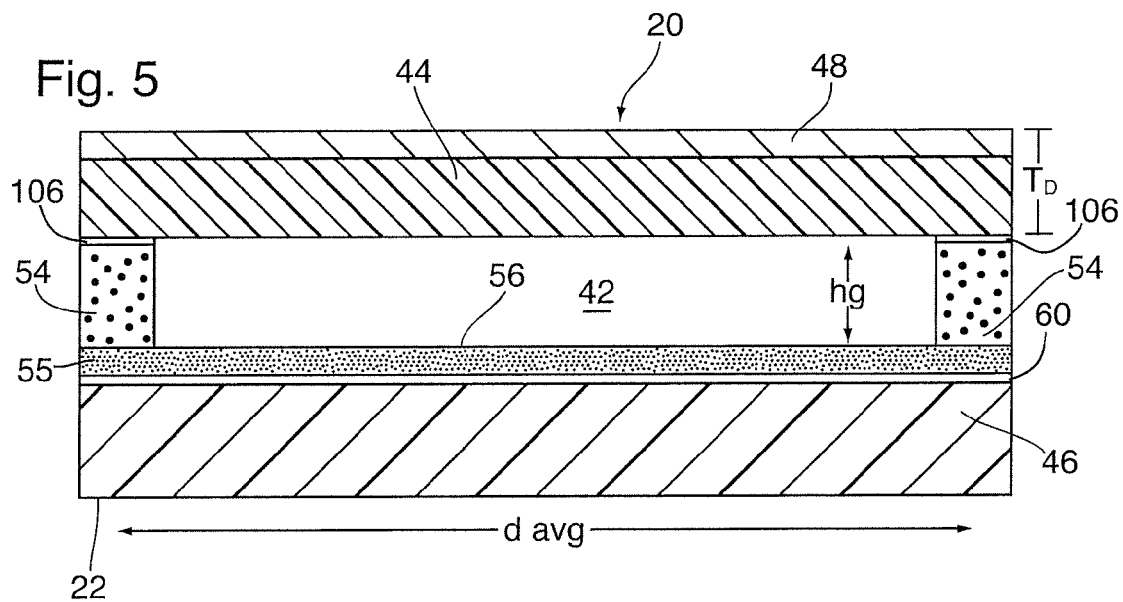
FIG. 5 provides an enlarged cross-sectional view of an individual CMUT transducer used in the ultrasonic sensor CMUT microarray module shown of FIG. 2, in accordance with a preferred method of manufacture.

FIG. 5 shows best an enlarged cross-sectional view of an individual transducer 20 found in each CMUT microarray module 16 in accordance with a first construction. In particular, the transducer 20 is provided with a generally square-shaped central air cavity or air gap 42. The transducers 20 each have an average square lateral width dimension $d_{avg}$ selected at between about 20 and 50 µm, and preferably about 30 µm, with the interior air gap 42 extending between about 60 and 80% of the lateral width of the transducer 20. Preferably the air gap 42 is defined in it Z-direction by a structural BCB resin layer 54 which as will be described is bonded with and adhered to a BCB adhesive layer 55. The air gap 42 is substantially defined at its lower extent by the BCB layer 55, and which depending on manufacture may or may not be bonded to a silicon bottom wafer 46 by a layer of adhesive coating or adhesion promoter layer 60.

The air gap 42 has a height $h_g$ selected at upto 3 microns, preferably between about 800 to 1000 nm, and more preferably about 900 nm. The air gap 42 is overlain by 0.5 to 1 µM, and preferably about a 0.8 µm thick silicon device layer or diaphragm membrane 44. A 0.1 to 0.2 µm thick gold conductive layer 48 is coated over the diaphragm membrane 44 of the transducers 20 in each microarray module 16. The conductive layer 48 thickness is selected so as not to interfere with diaphragm 44 movement. In addition, the bottom conductive coating 50 maybe provided either directly along a rear surface of the silicon bottom wafer or layer 46 of each transducer 20, or as described more preferably is pre-applied over each mounting surface 24 of the backing platform 18. In this manner, by electrically coupling the top conductive layer 48 of each microarray module 16 and the conductive coating layer 50 on the backing platform 18 to a frequency generator (shown as 70 in FIG. 9), the diaphragm membranes 44 of the transducers 20 may be activated to emit and/or receive and sense generated ultrasonic signals.

As shown best in FIG. 3, where used in vehicular applications the individual CMUT microarray modules 16 are concurrently operable to transmit and receive a beam signal at a frequency at a range of between about 113-167 kHz. Most preferably in rain or fog environments the modules 16 operate with signal frequencies of about 150 kHz±13, and a beamwidth of 20+5° with a maximum sidelobe intensity of –6 dB. The sensor microarray module 16 may provide frequency independent broadband beam forming, without any microelectronic signal processing.

Figure 9:
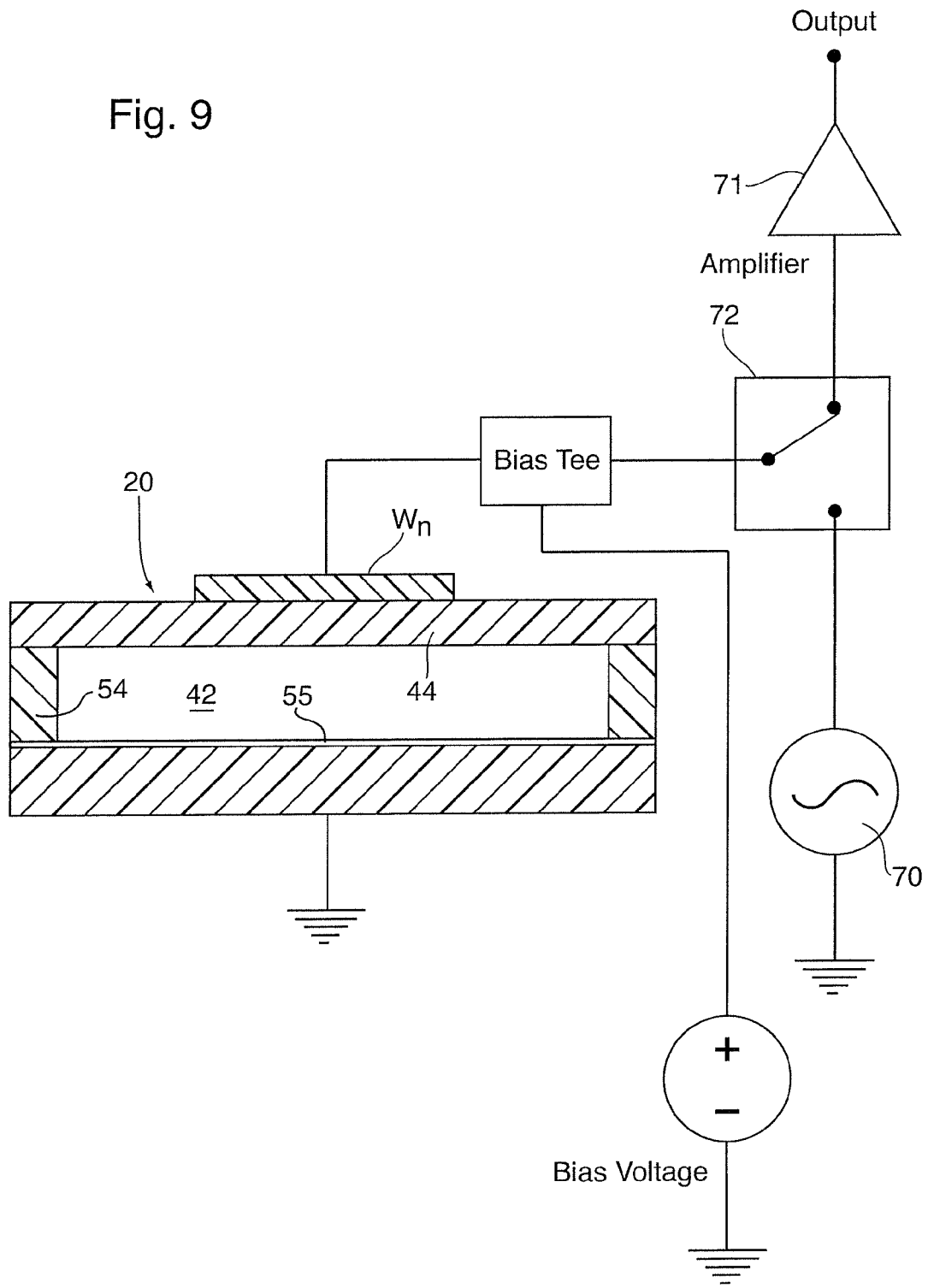
FIG. 9 illustrates schematically the operation of the individual transducer/sensors of the CMUT microarray modules shown in FIG. 7.

In one possible method of manufacture, the transducers 20 may be fabricated using a silicon-on-insulator (SOI) technology, with the three-dimensional backing platform 18 formed of silicon, and are assembled and packaged in a programmable gain amplifier PGA-68 package 71 (FIG. 9). The present invention also provides for a more simplified method of manufacturing the three-dimensional hyperbolic paraboloid chip 36 construct, and more preferably wherein the hyperbolic paraboloid chip 36 functions with the hyperbolic paraboloid geometry capacitive micromachined ultrasonic transducer. In this regard, the three-dimensional chip 36 may be assembled using a backing platform 18 formed from plastic, and more preferably acrylonitrile butadiene styrene (ABS), that is formed to shape by means of a 3D printing process. In an alternate production method the 3D chip backing platform 18 may be formed by injection molding through micro-molding injection molding processes.

In manufacture, the backing platform 18 having the desired discretized formed three dimensional surface (and preferably formed of ABS plastic) is coated with a suitable conductive metal deposited coating layer 50 using sputtering, electroplating, electroless plating/coating, plasma coating and/or other metalizing processes. The mode of metal deposition is selected to enable placement of a continuous controlled layer of conductive metal over the top face of the ABS plastic backing platform 18. The conductive metal coating layer 50 is selected to provide a ground conductor for one side of the transducers 20 within each microarray module 16. Preferred metals for deposition include copper, gold, silver, aluminum or other highly electrically conductive metals. Each CMUT microarray module 16 is thereafter positioned and adhered with a conductive adhesive directly on to an associated mounting surface 24 in electrical contact with the conductive metal coating layer 50 of the backing platform 18, with the backing platform 18 mounted to the pin base 34 using pin connectors 32.

While in a simplified construction, the forward face 19 of the transducer sensors 20 in each microarray module 16 provide a generally planar surface, the invention is not so limited. In an alternate construction, the forward face 19 of each microarray module 16 may be provided with or adapted for curvature. In such an arrangement, the transducers 20 within each of the CMUT microarray module 16 are themselves assembled directly on a flexible and compliable bottom or backing substrate (not shown). Such a backing substrate is selected from a material and having a thickness to allow microarray module 16 to be flexed or bent to better conform to an actual 3D hyperbolic paraboloid surface as a continuous free-form surface, as opposed to stepped surfaces that approximate such a free-form surface. Preferred flexible backings for the microarray modules 16 would include the silicon wafer backings 46 themselves having thicknesses of less than about 5 µm, and preferably less than 1 µm, as well as backing layers made from Cylothane™ or bisbenzocyclobutene (BCB). Such a free-form surface advantageously also would allow the flexible backing of each CMUT microarray module 16 to be placed directly onto a free-form molded backing platform 18, providing the sensor chip 36 with a more accurate approximation of an actual hyperbolic paraboloid surface topography.

The inventor has recognized that when used as part of a vehicle monitoring system 12, the operating range of the CMUT microarray modules 16 may prove to have increased importance. Although not essential, preferably, to design for a specific range, distance damping and absorption attenuation of the air at the specific operating point is determined. Damping of sound is generally known to be calculated with the theory of the air damping (air resistance) as below:

$$P_{SPLdamping} = -20 \log_{10}(R_1/R_2)$$

Where $R_1$ is 30 cms for SPL standardization purposes, and $R_2$ is the maximum distance to reach. For 5 in of distance, the ultrasound should travel 10 m. Solving the equation yields –30 dB of damping in 10 m distance. Also, the absorption of the air due to humidity is calculated as follows:

$$\alpha(f) = 0.022f - 0.6 \text{ dB/ft}$$

Where $\alpha$ is the air absorption due to frequency f. The humidity is taken as 100% for the worst case scenario. Over the range of 10 m after conversion from ft, this absorption value is calculated to be –53 dB for 150 kHz.

It is therefore to be recognized when the total values there may exist significant damping of –83 dB. In contrast, the applicant has recognized that if the transducers 20 were operated in 60 kHz, total damping and absorption would be –51 dB, which will allow a much powerful received ultrasound signal.

In the construction of FIG. 2, after obtaining the total damping and absorption values, the individual transducers 20 are designed accordingly. In particular, since the total damping values add up to –83 dB, the CMUT transducers 20 are most preferably designed to have very high output pressure, and most optionally 100 dB SPL or more. It has been recognized that preferably the diaphragm membrane 44 (FIG. 5) of the CMUT transducers 20 is chosen with a thickness ($T_D$) (FIG. 5) less than 20 urn, preferably less than 5 µm, and most preferably about 1 µm. The selected membrane dimensions allow the diaphragm membrane 44 to have a large distance for vibration, and a lower DC operating voltage.

Also following Mason's theory, (see *Design of a MEMS Discretized Hyperbolic Paraboloid Geometry Ultrasonic Sensor Microarray*, IEEE Transactions On Ultrasonics, Ferroelectrics, and Frequency Control, Vol. 55, No. 6, June 2008, the disclosure of which is incorporated hereby reference), each CMUT transducer 20 is designed to operate over a frequency range of 110 to 163 kHz, and with the sensor assembly 14 having twenty-five microarray modules 16 in accordance with specifications shown in Table 1. A most preferred operating frequency is selected at about 150 kHz±13, with the 5×5 array of CMUT microarray modules 16 designed with a 40° –3 dB bandwidth and side lobes lower than –10 Db, as shown in FIG. 3. In this regard sound pressure can be found following the equation:

$$P_a = Re(Z_m) \omega A_a$$

Where $A_a$ is the amplitude of the acoustic wave, which is equal to the displacement of the CMUT membrane, $\omega$ is the angular frequency of the diaphragm and $Z_m$ is acoustic radiative impedance of the membrane obtained from Mason's method reference above.

TABLE 2

CMUT Sensor Array specifications - AUTOMOTIVE VEHICLE SENSOR

| Parameter | Value |
|---|---|
| Module Array | 5 × 5 |
| Array −3 dB beamwidth (°) | 40° |
| Sensor sidelength (mm) | 15.75 |
| CMUT microarray module sidelength (mm) | 1.6-1.8 |
| CMUT transducer diaphragm material | Low resistivity polysilicon |
| CMUT transducer sidelength (mm) | 0.25-0.3 |
| CMUT transducer diaphragm thickness (μm) | 0.5-1.0 |
| CMUT transducer resonant frequency (kHz) | 150 (±13) |
| CMUT transducer air-gap (μm) | 2.5-4 |
| Array pressure output (dB SPL) | 102.5 |
| CMUT bias voltage ($V_{DC}$) | 40 |
| CMUT pull-in voltage ($V_{DC}$) | 51 |
| CMUT receive sensitivity (mV/Pa) | 60 |
| Received signal at 10 m (mV) | 2 |

Table 2 above overviews the sensor array specifications of a prototype automotive vehicle sensor used as a backup sensor to provide obstruction warning signals.

Figure 6:
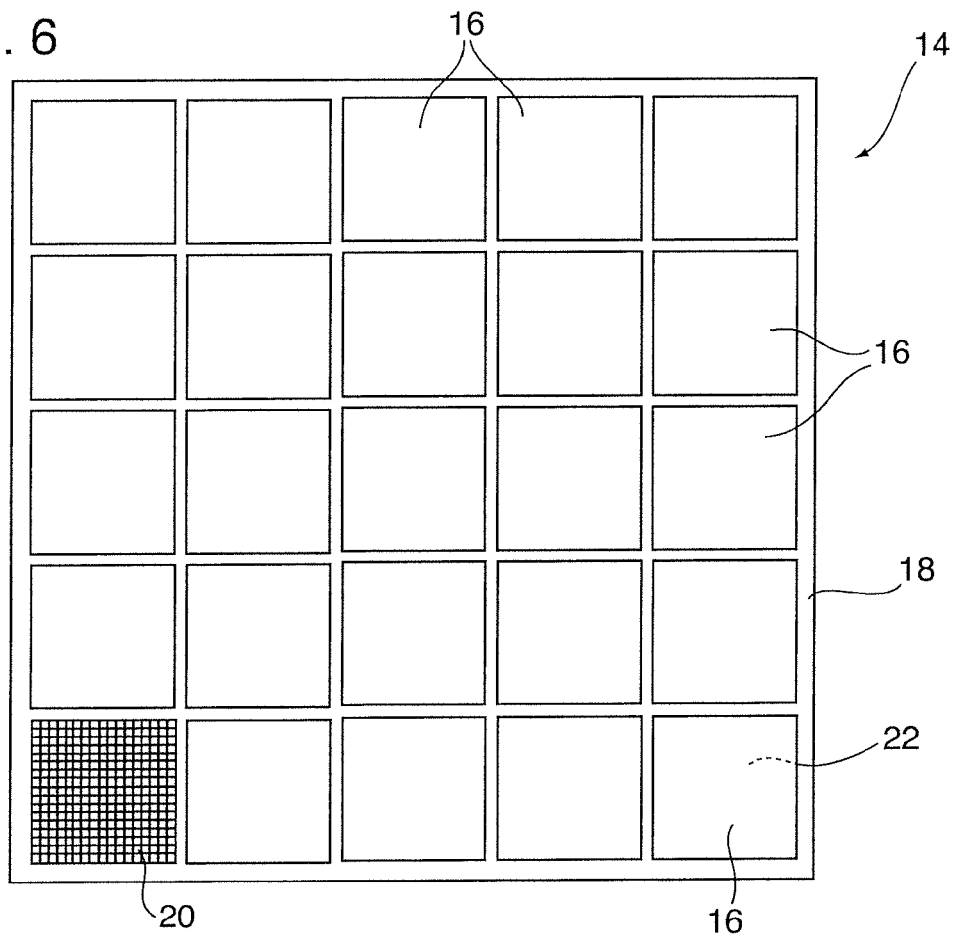
FIG. 6 illustrates schematically an ultrasonic sensor assembly having a 5×5 array construct of twenty-five CMUT microarray modules in accordance with another embodiment of the invention.

FIG. 6 illustrates an ultrasonic sensor assembly 14 in accordance with a preferred embodiment of the invention, in which like reference numerals are used to identify like components. In FIG. 6, the ultrasonic sensor assembly 14 is provided with a 5×5 square array of twenty-five CMUT microarray modules 16. Each of the CMUT microarray modules 16 are in turn formed as a square 40×40 matrix of 1600 individual transducers 20 (not shown to scale). While FIG. 6 illustrates the sensor assembly 14 as including twenty-five CMUT microarray modules 16 arranged in a 5×5 matrix configuration, the invention is not so limited. It is to be appreciated that in alternate constructions, greater or smaller number of microarray modules 16 having fewer or more transducers 20 may be provided. Such configurations would include without limitation rectangular strip, generally circular and/or to the geometric or amorphous groupings of modules; as well as groupings of forty-nine or fifty-four CMUT microarray modules 16 mounted in 7×7, 9×9 or other square arrangements.

In one possible embodiment the 40×40 CMUT microarray modules 16 are secured to an ABS backing platform 18 which has a geometry similar to that shown in FIG. 4, and which has been discretized in about a 2×2 mm, and preferably 1.7×1.7 mm flat mounting surfaces 24. In such a construction, the backing platform 18 is formed as an approximated hyperbolic paraboloid surface in the manner described above.

In an alternate design, the backing platform 18 is made as a substantially flat ABS construct, having a hyperbolic paraboloid curvature less than about ±10°, preferably less than about ±1°, and more preferably less than ±0.5°, wherein one or more of the transducers 20 within each CMUT microarray module 16 is operable to more closely simulate their mounting in a hyperbolic paraboloid geometry. The microarrays modules 16 are electrically bonded on their rearward side 22 (FIG. 5) to the conductive metal coating layer 50 which has been bonded as a metal layer deposited on the ABS backing platform 18 in the manner as described above. In one construction, the top metal conductive layer 48, as shown in FIG. 5, is provided as the second other power conductor for the CMUT transducers 20, allowing each microarray 16 to operate in both send and receive mode. As will be described however alternatively transducers 20 each module 16 may be electrically connected in discrete groupings.

Figure 10:
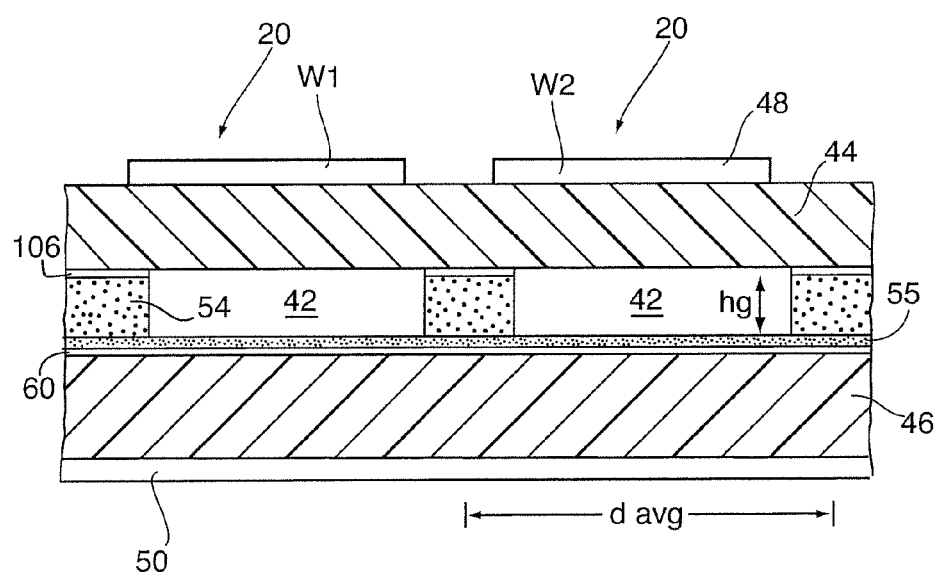
FIG. 10 illustrates schematically an enlarged partial cross-sectional view of a transducer/sensor used in the CMUT microarray module shown in FIG. 7.
Figure 11:
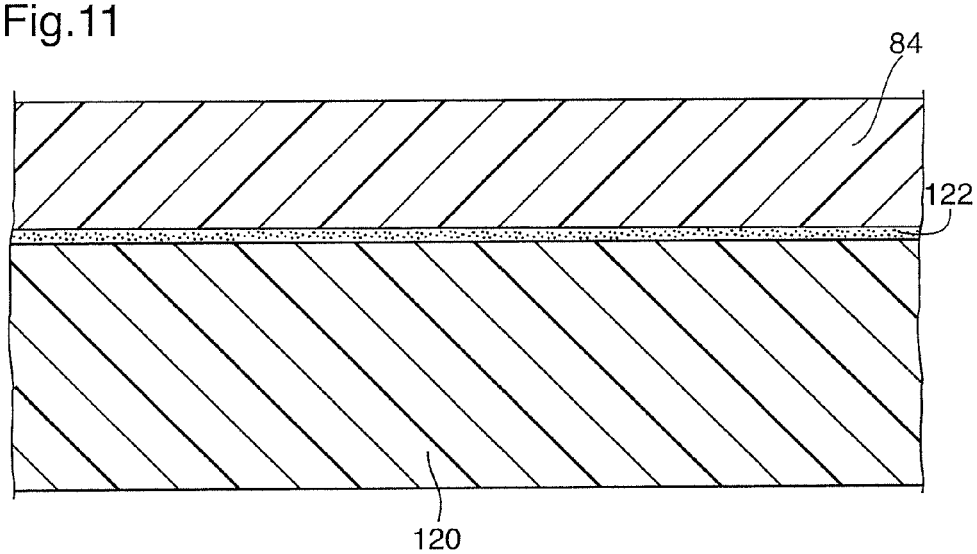
FIG. 11 illustrates schematically the positioning of a silicon wafer on a handling layer for use in manufacturing the device layer of the transducer/sensor shown in FIG. 10.
Figure 12:
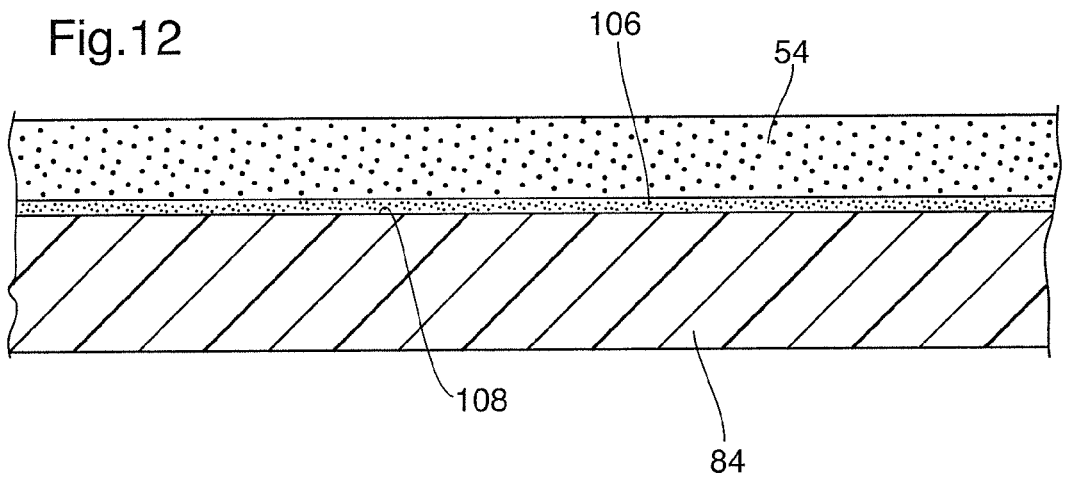
FIG. 12 illustrates schematically the manufacture of a top wafer layer construct of FIG. 11, with a BCB bonding coating layer applied to the device layer.
Figure 13:
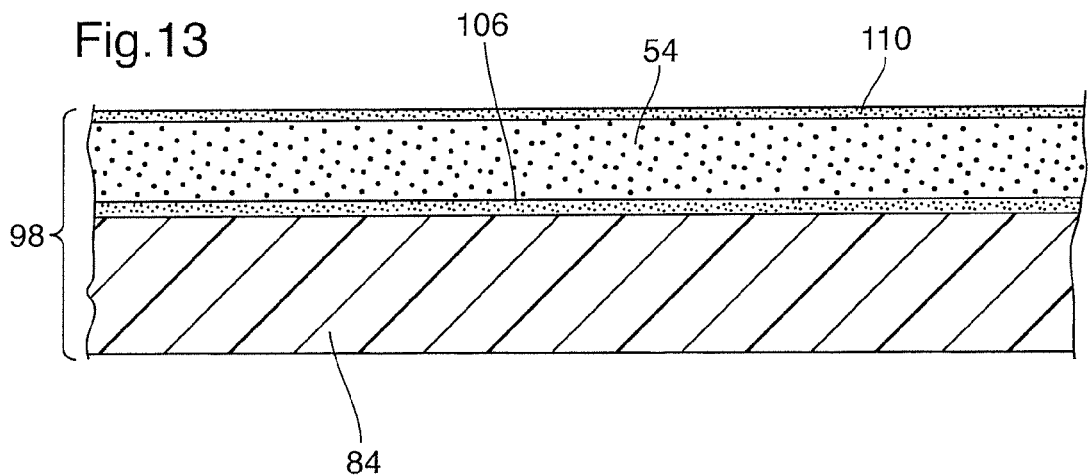
FIG. 13 illustrates schematically the application of a top photoresist layer on the applied BCB layer illustrated in FIG. 12.
Figure 14:
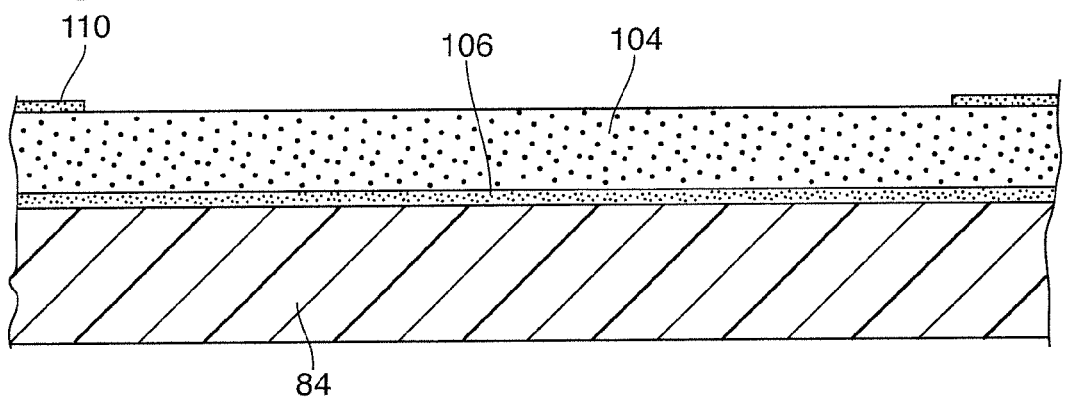
FIG. 14 illustrates schematically the partial removal of the photo-resist layer shown in FIG. 13 in the BCB layer etching.

FIG. 7 shows an embodiment wherein each 40×40 microarray module 16 has a square construction of between about 1 and 3 mm in sidewidth and contains approximately 1600 transducers 20. As shown best in FIG. 7 the transducers 20 are arranged in a square matrix orientation of parallel rows and columns within each microarray module 16. The transducers 20 used in the module 16 of FIG. 7 are shown best in the cross-sectional view of FIG. 10 as having an average lateral width dimension $d_{avg}$ selected at between about 0.02 to 0.05 mm and more preferably about 0.03 mm. Each transducer 20 defines a respective rectangular air gap 42 (FIG. 10) which has a height $h_g$ of up to 5 μm, preferably between about 0.5 to 4 μm, and more preferably about 900 nm, width in lateral direction selected at between about 0.01 and 0.04 mm, and preferably about 28 μm. FIG. 10 further shows best the transducers 20 as having a simplified construction including a BCB coated silicon bottom wafer or backing layer 46. As will be described, the BCB adhesive layer 55 is in turn bonded to an etched 1 to 50 μm, and preferably 4 to 20 μm thick layer 54 of Cyclotene™ or other suitable bisbenzocyclobutene (BCB) resin layer 54 which is adhered to upper top silicon wafer 84. As will be described, the top wafer 84 defines each device diaphragm membrane 44, and has a thickness selected at less than about 1.0 μm, and preferably in the 800 to 1000 nm range.

Although not essential, FIG. 7 shows the gold conductive layer 48 is divided into individual, electrically isolated conductive gold wire strip bondings ($W_1, W_2 \ldots W_n$). The wire strip bondings $W_1, W_2 \ldots W_n$ provided across the diaphragm membranes 44 of aligned rows of transducers 20 and are each selectively electrically connected to the frequency generator 70 by way of a switching circuit 72.

In assembly, each 40×40 microarray module 16 is positioned as a discrete unit on the substantially flat substrate or backing layer 18. Within each individual 40×40 microarray module 16, the transducers 20 are grouped into parallel strips or columns $S_1, S_2, \ldots S_{40}$ (FIG. 7). The transducers 20 in each column $S_1, S_2, \ldots S_{40}$, are electrically connected to each other by an overlaying associated conductive gold wire bonding $W_1, W_2, W_3 \ldots W_{40}$. As shown in FIG. 7, the gold wire bondings $W_1, W_2, W_3 \ldots W_{40}$ are in turn selectively electrically coupled to the conventional frequency generator 70 by way of a switching circuit 72 and microprocessor controller 74. The frequency generator 70 is operable to selectively provide electrical signals or pulses at pre-selected frequencies. The applicant has appreciated that the activation of each individual or selected columns $S_1, S_2 \ldots S_{40}$ of transducers 20 within each microarray 16 may change in the output wavelength of the sensor assembly 14 by a factor of approximately 0.1λ. By activating the switching circuit 72 to selectively switch power on and off to different combinations of columns $S_1, S_2, \ldots S_{40}$ of transducers 20 in each microarray module 16, it is possible to alter the signal shape of the transmitting signal wavelength output from the sensor assembly 14.

The generation of each electric pulse by the frequency generator 70 may thus be used to effect the physical displacement of the diaphragm membranes 44 of each transducer 20 within one or more selected columns $S_1, S_2, \ldots S_{40}$ electrically connected thereto, by the switching assembly 72, to produce a desired output ultrasonic wave frequency and/or profile having regard to the operation mode of the sensor assembly 14. The applicant has appreciated that in a most preferred configuration, signals are output from the sensor assembly 14 at wavelengths of between 110 kHz to 163 kHz, and preferably about 150 kHz. By the selective activation and deactivation of individual columns $S_1, S_2 \ldots S_{40}$ of transducers 20 in each microarray module 16, the output beamwidth and/or frequency, may be controlled depending upon the particular application requirement for the sensor system 12.

Figure 8A:
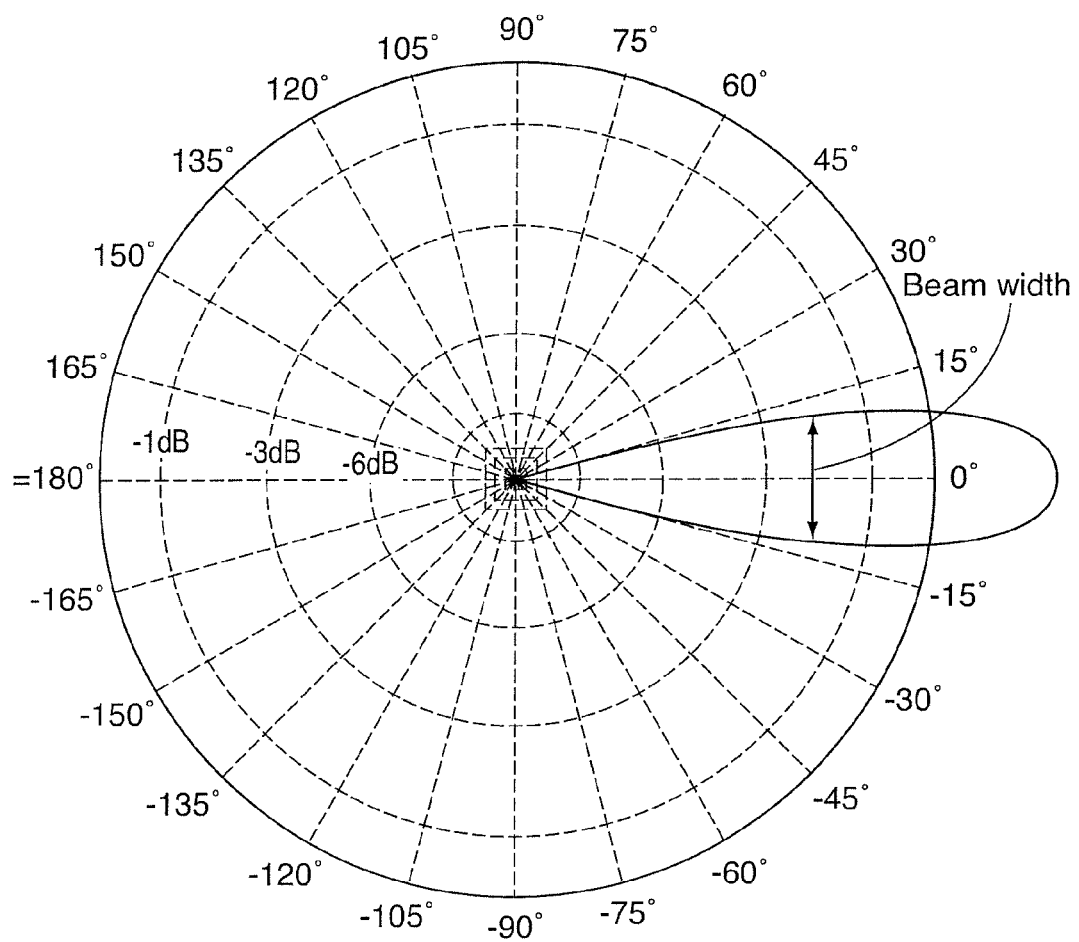
FIGS. 8a, 8b, and 8c illustrate polar plots of selected beam output geometries of output signals from the ultrasonic sensor assembly shown in FIG. 6.
Figure 8B:
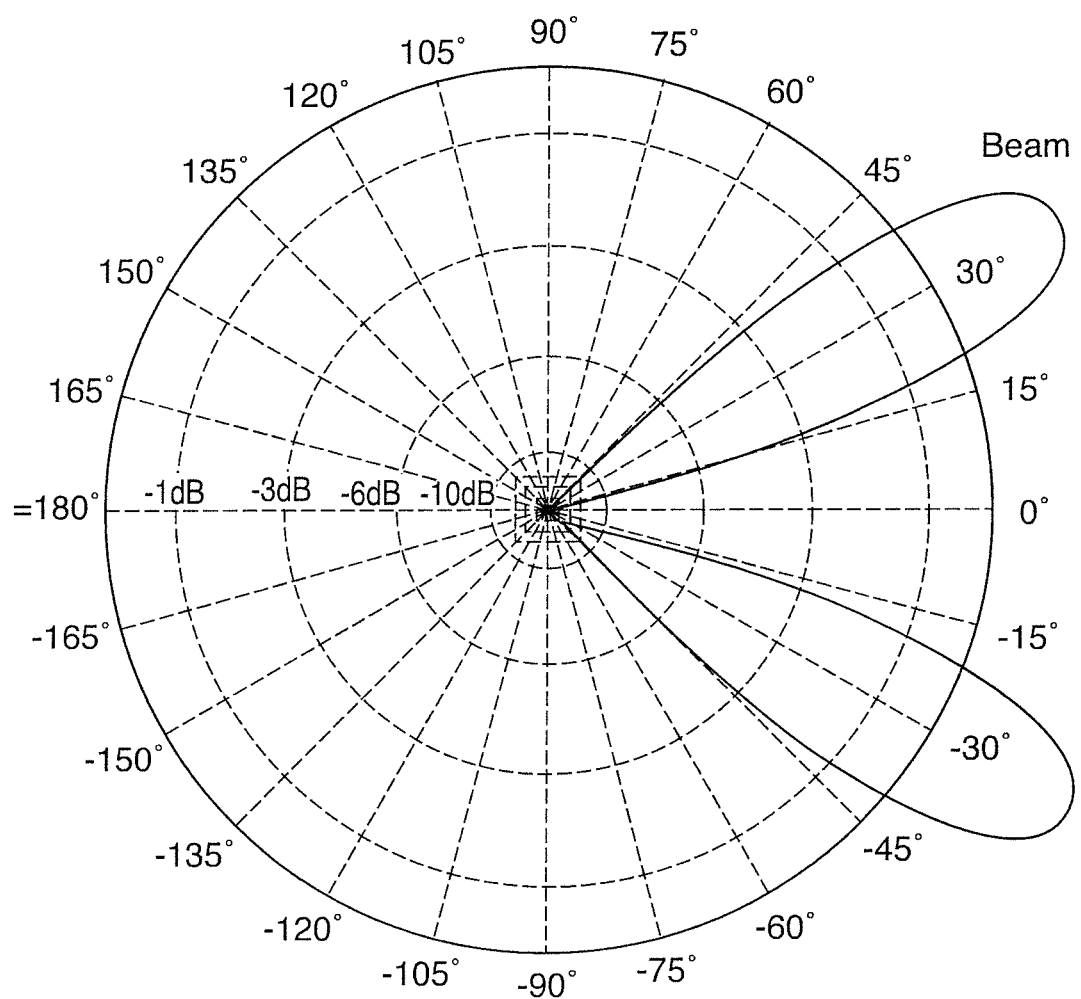
Figure 8C:
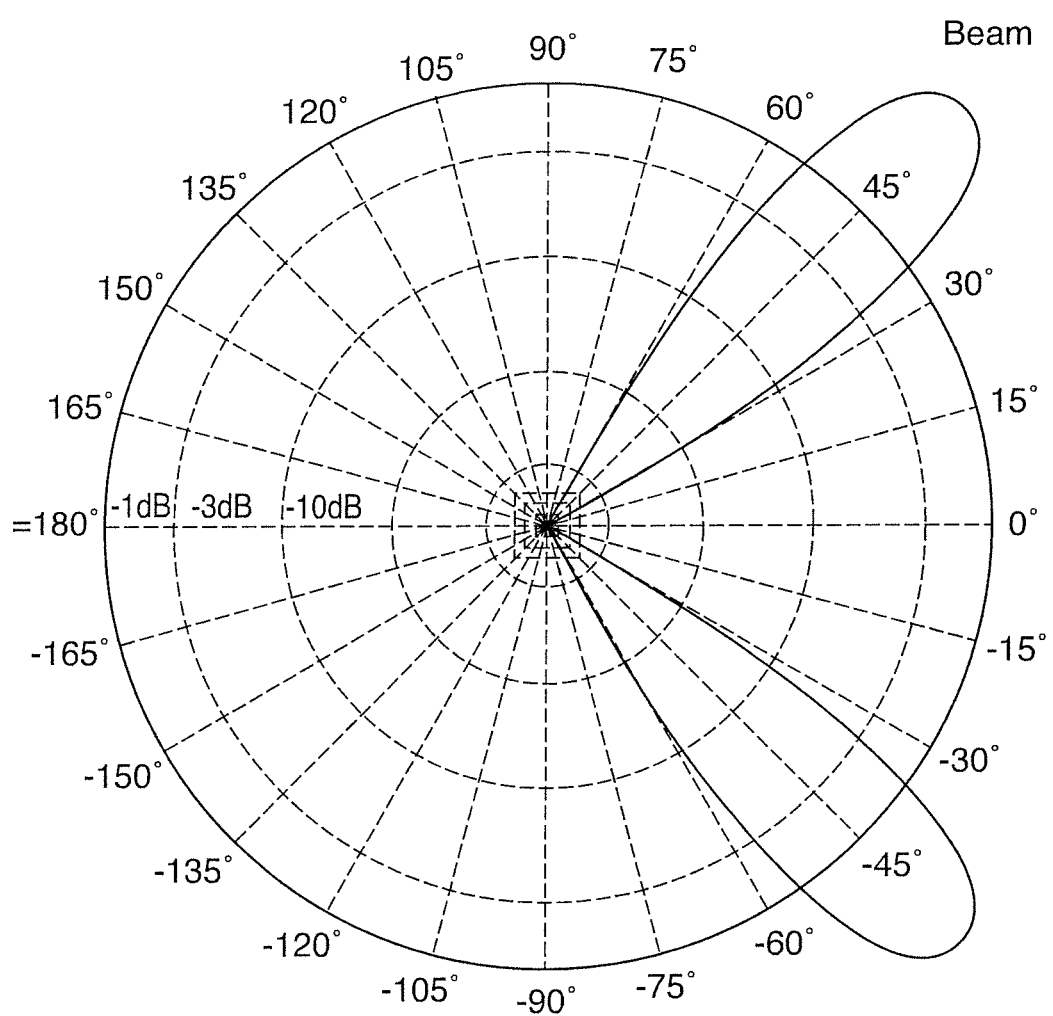

By example, FIGS. 8a to 8c show that depending upon the application requirements or mode of vehicle operation, it is possible to selective activate individual transducers 20 in each microarray module 16 to output a wider beam, where for example, the sensor assembly 14 is used to provide warning signals in low speed back-up assist applications. In addition, different transducer 20 combinations in the same sensor assembly 14 may be activated to provide a narrower longer beamwidth, where for example, the vehicle is being driven at speed, and the sensor assembly 14 is operating to provide a blind-spot warning, as for example, during vehicle passing or lane change. In a most preferred mode of operation, the controller 74 is used to control the switching circuit 72 to activate the same sequences of columns $S_1, S_2 \ldots S_{40}$ of transducers 20 within each of the CMUT microarray module 16 concurrently during operation of the sensor assembly 14. This advantageously may minimize any adverse nodal effects and/or signal interference between signals output by the individual CMUT microarray module 16 within the sensor.

In another mode of operation, the microprocessor controller 74 may be used to activate the switching circuit 72 to selective actuate the columns $S_1, S_2 \ldots S_{40}$ of transducers 20 in predetermined sequences to output signals of changing frequency. In yet another mode, the controller 74 may be used to activate the switching assembly 72 to initiate one or more individual columns $S_1, S_2 \ldots S_n$ of specific transducers 20 within only selected microarray modules 16 within the 5×5 array. In this regard, the signals output by the sensor assembly 14 may be coded or sequenced across a frequency range to more readily allow for the differentiation of third party sensor signals, minimizing the possibility of cross-sensor interference or false warning.

It is envisioned that the sensor assembly 14 shown in FIG. 7 thus advantageously allows for programmable beamwidths to be selected at 20 and 140° or more, by using the controller 74 and switching circuit 72 to change the sensor output wavelength dynamic. While FIG. 7 illustrates the transducers 20 within each CMUT microarray module 16 as being divided into forty separate columns $S_1, S_2 \ldots S_{40}$, it is to be appreciated that in alternate configuration the transducers 20 in each microarray 16 may be further grouped and/or alternately individually controlled. In one non-limiting example, the transducers 20 may be further grouped and electrically connected by row, with individual columns and/or rows within each CMUT microarray module 16 being selectively actuatable by the controller 74, switching circuit 72 and frequency generator 70.

One non-limiting sensor design provides for a 40×40 CMUT microarray modules 16 having a square configuration, with the sensor chip 36 having a dimension of about 7 to 10 mm per side, and which is machined flat or substantially for marginally hyperbolic with the ±0.5° curvature. Preliminary testing indicates that the ultrasonic sensor assembly 14 is operable to transmit and receive signals through solid plastic bumper materials having thicknesses of upto several millimeters, and without the requirement to have currently existing "buttons" or collectors. As such, the sensor assembly 14 may advantageously be "installed behind the bumper" in automotive applications, using smooth surfaced bumper panels, creating a more aesthetically pleasing appearance.

In operation, in receive mode (shown schematically in FIG. 9) all of the CMUT transducers 20 preferably are activated to receive return beam signals to the output at the same time. The beam strength of the signals received, and/or the response time is thus used to determine obstruction proximity. In receive mode, the entirety of each CMUT microarray module 16 receives signals by impact which results in defection of the transducer diaphragm membranes 44 to generate receptor signals. The intensity and time of flight of the return signals detected by the degree of defection of each diaphragm membrane 44 provides an indication as to the proximity of an adjacent obstruction and/or vehicle.

Transducer Manufacture

In one process of manufacture, benzocyclobutene (BCB) is provided as both the structural Z-dimension component and the primary bonding material used in the manufacture of each transducer 20 in bonding silicon and silicon-on-insulator (SOI) wafers. As will be described, in a simplified mode of manufacture, sheets of transducers are formed by bonding together two silicon and/or silicon-on-insulator wafers 80,84 onto which partially cured BCB layers have been applied, to form multiple CMUT microarray modules 16. After bonding, the wafers 80,84 are then cut into separate the individual modules 16 from the bonded wafer sheet assembly, with portions of each wafer 80,84 functioning respectively as a transducer bottom wafer 46 and the transducer device layer 44.

Figure 15:
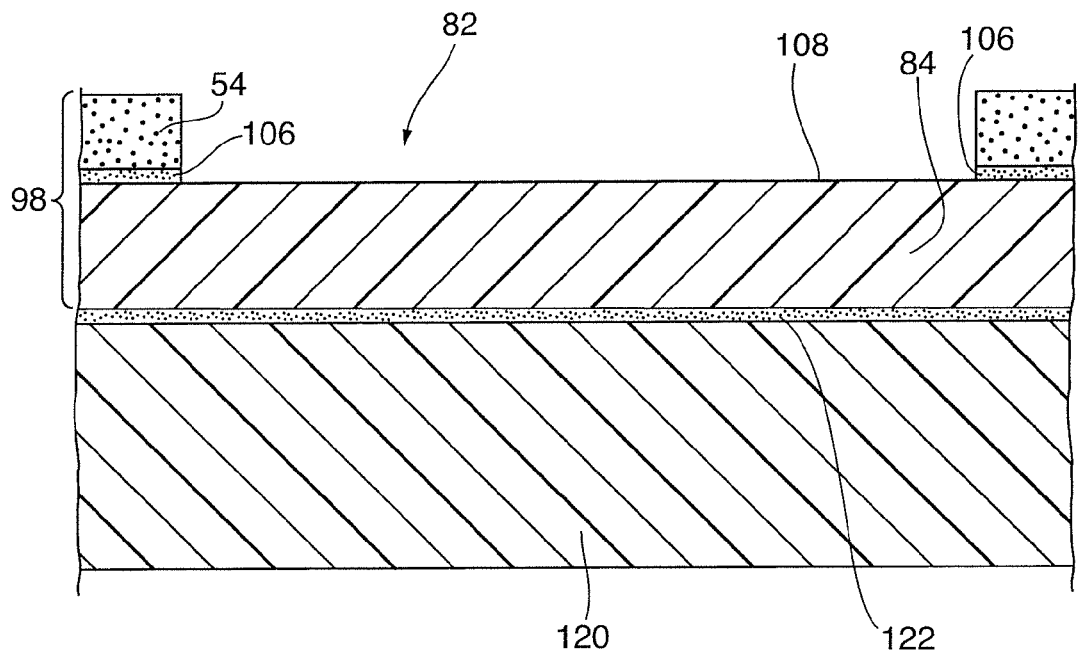
FIG. 15 illustrates schematically the partial etching of the BCB layer shown in FIG. 14, and the subsequent application of an adhesive promoter layer.

In a preferred mode of manufacture of each 40×40 microarray module 16 is performed largely as a two-component manufacturing process. In manufacture, the microarray module 16 is prepared by joining an silicon wafer backing layer 80 (FIG. 16) to a second covering top silicon wafer 84 which functions as the device layer 44 (FIG. 15) by fusing together an etched and partially cured BCB resin layer 54 and a partially cured BCB coating layer 55. The BCB layers 54,55 are preferably Cyclotene, and provide the desired transducer air gap 42 height $h_g$ or thickness in the Z-direction.

While in one embodiment, the silicon wafer backing layer 80 functions as the bottom layer 46 of each individual transducer 20, with the top silicon layer or wafer 84, following trimming, functions as the displaceable diaphragm 44. In one preferred process described, the BCB resin layer 54, which optionally may be partially diluted with mesitylene, is applied to the top silicon wafer 84 as part of a top silicon-on-insulator preform half 98. The BCB layer 54 is partially cured, and then etched to form individual pockets 82 (FIG. 15) which, after assembly and joining with a lower preform halve 100 (FIG. 16), form the individual transducer air gaps 42. It is to be appreciated that with the present process, in an alternate configuration, the BCB resin layer 55 applied to the bottom silicon wafer 80 may be partially cured and etched, with the top resin layer 54 and silicon wafer 84 bonded thereto, such that the microarray module 16 is manufactured in an inverted fashion.

The formation of the upper preform half 98 is best described more fully with reference to FIGS. 11 to 15. As shown best in FIG. 11, a silicon wafer 84, and preferably an N-type silicon wafer is secured to a removable silicon holder piece 120 (not shown to scale) by means of the layer of silicon dioxide 122. In this manner, the silicon dioxide layer 122 is provided as a dissolvable adhesive which is coated on the silicon holder piece 120, with the dissolvable adhesive 122 securing the silicon wafer 84, mounted thereto, the wafer 84 is machined on the preform 98 by grinding or laser ablation to a desired final device layer thickness. While the wafer 84 is preferably selected as a silicon wafer machined or laser etched to a desired thickness, in alternate construction, the device layer could be spin formed from other suitable materials or resins. The silicon wafer 84 may optionally be heavily doped with Antimony to achieve resistance in the range of 0.008 to 0.02 Ω·cm².

Although not essential, the silicon holder layer 120 (omitted from FIGS. 12 to 14 for clarity) allows for easier handling of the silicon wafer layer 84, together with its final sizing to provide each transducer 20 with a device layer 44 having the desired thickness. In preferred construction, the silicon wafer layer 84 is provided with a thickness is the Z-direction selected at between about 0.1 to 10 μm and preferably about 0.8 to 0.9 μm. Thinner or thicker wafers may, however, be used.

An adhesion promoter layer 106 (FIG. 12) such as AP3000™ is optionally next applied to a bottom surface 108 of the silicon wafer 84, to prepare the surface for BCB coating. The adhesion promoter layer 106 is applied to the surface 108 of the silicon wafer 84 by spin coating in a thickness less than 0.5 μm and preferably less than 0.1 μm, and then spun dry and/or neat dried on a hot plate at about 150° C. for less than 10 minutes. The resulting layer surface 106 is then immediately ready for BCB coating to form the structural layer 54.

Following the application of the adhesion promoter layer 106, the BCB layer 54 is applied and then only partially cured preferably to between about 30% to 70% of a fully cured state. Most preferably, the BCB layer 54 is selected as Cyclotene™ resin which has been thinned with Mesitylene in a 2:1 ratio is provided with a thickness in the Z-axis direction of upto 50 microns, and preferably upto 10 μm, and most preferably at between about 0.1 to 5 microns. The BCB layer 54 provides various advantages. In particular, the use of the BCB layer 54 acts as an electrically insulating (non-conductive) structural layer. In addition, the applicant has appreciated that the partially cured BCB layer 54 advantageously allows for some deformation, enabling a more forgiving fit with both the silicon wafer 84 and the upper surface of the preform half 100 in final assembly. This in turn advantageously allows for higher production yields with more consistent results.

Most preferably, the BCB layer 54 is formed by spin deposition and semi-cured to about a 50% fully cured state by heating under vacuum conditions for approximately one-half the rated time required to achieve full curing, having regard to the Z-direction layer thickness, and preferably at low rated temperatures and preferably in the case of Cyclotene, at temperatures less than about 200° C.

Following the desired partial curing of the BCB layer 54, the preform half 98 is masked using a photoresist coating 110 (FIG. 13), and preferably a 0.5 micrometer thickness Shipley 1805 photoresist layer 110, which may be optionally spin deposited on top of the BCB structural layer 54. After soft baking of the photoresist at 150° C., the photoresist layer 110 is exposed to UV light to effect photolithography and remove the desired parts of the layer 110 with the location and geometry of the where pockets 82 are to be formed, exposing the underlying BCB layer 54. In particular, the mask coating 110 is applied to pattern the BCB layer 54 with the desired air pocket 82 (FIG. 15) configuration to achieve the intended size and orientation of the resulting transducer air gap arrays 42.

After exposure and activation, the non-activated remnant portions of the portions of the mask coating 110 are removed (FIG. 14) to expose the selected air pocket configuration and BCB layer 54 for photo plasma etching. Preferably, BCB layer 54 is then dry etched using $CF_4/O_2$ in an ICP (Inductively Coupled Plasma) reactor to form the pockets 82 (FIG. 15) in the pattern and orientation of the desired transducer air gap 42 configuration to be included in the microarray module 16. Again, the pockets 82 are formed with a size and desired spacing to function as the air gap 42 of each transducer. Most preferably, the pockets 82 are preferably formed with a width of upto 25 to 40 μm, and preferably 25 μm μm in each lateral direction, and to a depth of 2.5 to 5 microns. Most preferably each pocket 82 further extends through the BCB layer 54 to at least the underlying adhesion promoter layer 106. Optionally, etching may be performed to remove the underlying portion of the adhesion of the promoter layer 106, exposing the silicon device wafer 84 in each pocket 82.

The pockets 82 may be manufactured having a square shape to maximize their number and placement on the silicon backing wafer 80. Other embodiments could however include circular shaped pockets or recesses, resulting in a large ship and/or pockets of a polygonal and/or hexagonal shape. The formation of the pockets 82 in a square matrix orientation allows for simplified transducer switching, however, other configurations are also possible.

Following etching, the preform 98 is cleaned to remove any remaining mask coating 110, exposing the partially cured BCB layer 54.

Figure 16:
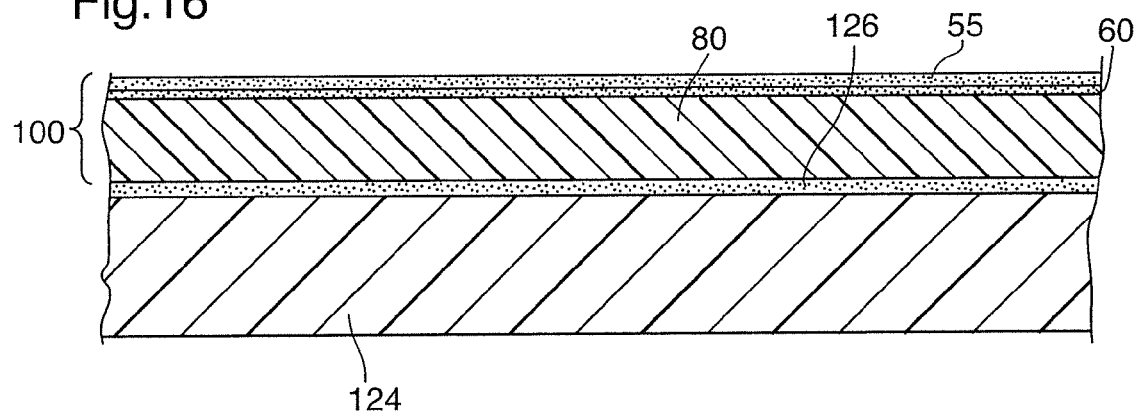
FIG. 16 illustrates schematically the formation of the bottom silicon wafer layer construct for use in accordance with a first method of manufacture.
Figure 17:
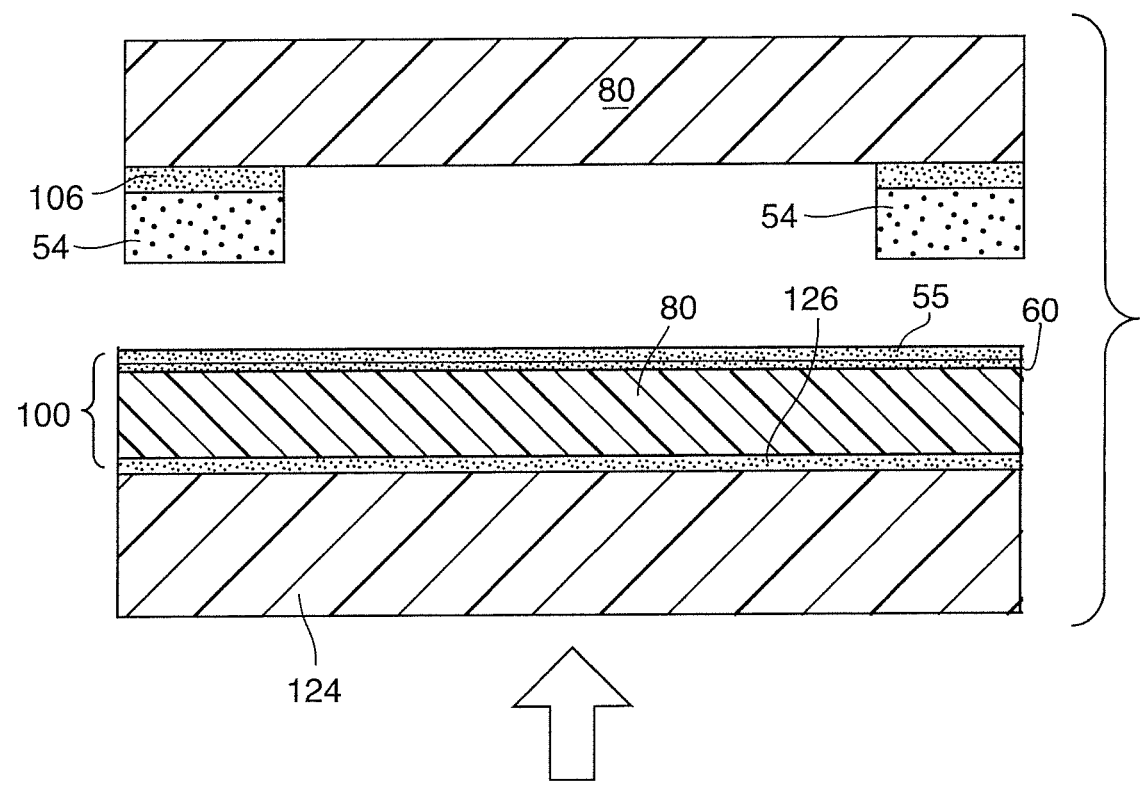
FIGS. 17 and 18 illustrate schematically the assembly top and bottom wafer constructs shown in FIGS. 15 and 16 prior to coating metal conductive layers thereon.

FIGS. 16 and 17 show best the formation of the lower preform half 100, and its positioning in juxtaposition with the preform 98. FIG. 16 illustrates the bottom silicon wafer 80 as being provided as part of a SOI wafer construct, wherein the wafer 80 is releasably secured to a holder layer 124 for simplified manufacture. The holder layer 124 may be selected from a further silicon layer which is used to mount the silicon wafer 80 by a dissolvable silicon oxide layer 126 or other suitable solvable adhesive. Alternately, the holder layer 124 could be formed as a BCB layer which is adhered to the silicon wafer 80 by 1 inn thick AP3000 layer. Again, in one simplified construction, the silicon layer 80 is machined from a standard silicon wafer, and which is double polished by grinding or laser ablation to a desired thickness, having regard to the intended thickness of the transducer backing layers. More preferably, the silicon layer 80 has a sensitivity selected at less than 0.01 Ω·-cm.

After grinding to the desired thickness, the silicon wafer 80 is cleaned using oxygen plasma for 10 minutes, as follows:
$O_2$: 40 Sccm
Chamber pressure: 50 mTorr
RF power: 30 W Following cleaning, the wafer 80 is next spin-washed in deionized (DI) water and vacuum dried. An adhesion promoter layer 60, such as AP3000™, is optionally then applied in a thickness less than about 0.9 μm, and preferably less than about 0.1 μm by spin coating with a spread speed of 100 rpm for 5 seconds and a spin speed of 3000 rpm for 20 seconds. To dry the adhesion promoter layer 60, the wafer construct 100 is heated on a hot plate for 1 min at 150° C., and then left to then cool down to room temperature.

The formation of the partially cured BCB layer 55 is preferably effected in substantially the same manner as the structural BCB layer 54. Cyclotene™ 3022-46 (BCB) diluted in Mesitylene in a 2:1 ratio by weight is then applied as a bonding layer 55 with a target thickness of 500 to 2000 nm, and preferably about 900 nm, before annealing. The BCB layer 55 is spin coated over the adhesion promoter layer 60 with an initial spread speed of 500 rpm for 5 seconds, followed by a spin speed of 4550 rpm for 45 seconds.

After BCB spin coating, the wafer construct 100 was soft-baked on a hot plate for 2 min at 100° C. Following soft baking the wafer was inspected for any layer non-uniformity, dirt or pin holes. If not satisfactory, the sample is cleaned and then the BCB coating procedure is repeated.

The freshly BCB coated wafer construct 100 was observed to be volatile, and preferably the BCB layer 55 is semi-cured in a vacuum chamber (~70 mbar). Preferred pre-annealing process steps are selected as follows:
Ramp to 150° C. in 60 min.
Stay 30 min at 150° C.
Ramp to 190° C.
Stay 60 min at 190° C.
Cool down to less than 150° C.

The pre-annealing and baking of the BCB layer 55 under vacuum conditions with lower temperatures effect degassing and achieves semi-curing of the BCB and with lower temperatures and less heat induced stress. This provides better control of layer height build/loss through degassing and semi-curing. Also the semi-curing allows the BCB layer 55 to build a better bond with the Si wafer 80. It is furthermore most preferred that the wafer be oriented in a horizontal position during the annealing period, as the BCB may tend to flow during this period.

Early sample results show that upto a 10% film thickness shrinkage may be possible as a result of the BCB annealing process.

In a simplified construction, the partially cured BCB layer wafer layer 55 is provided for mounting directed to the partially cured BCB layer 54 of wafer construct 98. The BCB layers 54 and/or 55, however, be optionally coated with an adhesion promoter layer (not shown) to facilitate bonding of the partially cured BCB layers 54,55.

Figure 18:
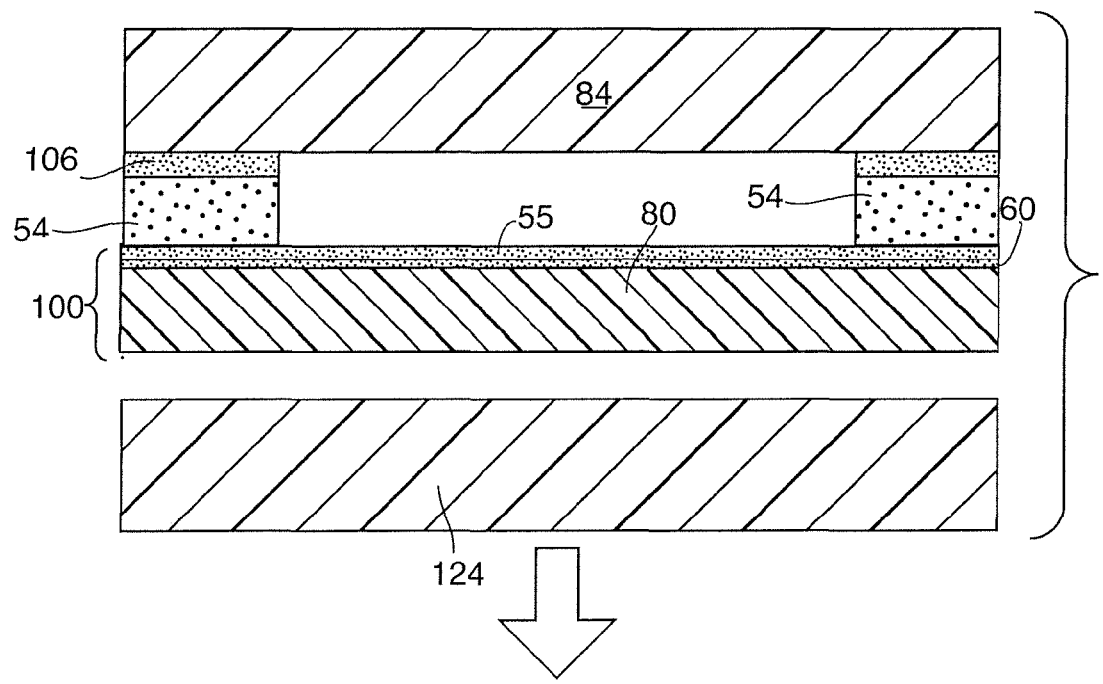

As shown in FIGS. 17 and 18, the preforms 98,100 are aligned under vacuum conditions and the BCB layer 55 is brought into contact against the BCB structural layer 54. On moving the layer 55 into alignment and contact against the BCB layer 54, the preforms 98,100 are then heated to higher temperatures and preferably 210° C. or greater for 60 minutes to fully cure and fuse the BCB layers 54,55 to each other sealing the transducer air gap 42 and joining the wafers 84,80.

In the final assembly, the adhesion of partially cured BCB 54 layer to BCB layer 55 facilitates a stronger bond, compared to partially cured BCB adhered directly to silicon. The thermal history of both the silicon and SOI wafers is further preferably chosen to be the same, to minimize the residual stress that may arise during the bonding procedure. For this reason the thermal procedure steps in preparing each of the wafer constructs 98,100 is preferably maintained substantially the same.

In bonding the BCB layers 54,55, the juxtaposed surfaces to be adhered to each other are aggressively cleaned both under plasma and deionized (DI) water. The two BCB layers 54,55 are preferably held apart until the vacuum is achieved, then placed together under pressure to be bonded. It is at this point under vacuum heat is introduced to initiate BCB to BCB bonding, and the full curing of the resin layers. While not essential, bonding temperatures are preferably maintained lower than manufacturer's recommended maximum curing to minimize residual stress in the assembly.

Since the BCB layers 54,55 are initially not yet fully cured and hard, on initial contact there is still some give and compliance in the two juxtaposed faces of the BCB material. As a result, the BCB layers 54,55 are able to deform to comply with any irregularities in the two faces, thus allowing for full contact between the layers 54,55, and for a better wetting out of the bonding surfaces. According to a preferred process, wafer bonding is effected under vacuum, where after plasma cleaning, the two wafers constructs 98,100 are placed into clamping fixture (not shown) that holds a gap between the opposed surfaces of the BCB layers 54,55, and which further maintains flat to flat aligmnent of wafers with or without the gap. To effect bonding of the BCB layers 54,55 the gap of clamping fixture is closed inside a vacuum furnace at room temperature when the vacuum reaches (~70 mbar). The fixture then applies pressure to bond the wafer constructs 98,100 together whilst maintaining vacuum and at an elevated temperature, continuing to anneal the wafers under annealing parameters are as follows:
Ramp to 150° C. in 60 min.
Stay 30 min at 150° C.
Ramp to 210° C.
Stay 60 min at 210° C.
Cool down to less than 150° C.

Most preferably following positioning of the silicon wafer 84 over the lower preform half 98, the preform halves 98,100 construct are heated to an initial bonding temperature of about 150° C., to drive out residual solvents and effect maximum bonding strength. In an alternate method of manufacture, the bonded halves 98,100 may be final cured at 250° C. in a nitrogen atmosphere for about one hour.

Optionally in an alternate process step, BCB layer could be applied and etching step repeated to create a mirror image relief on each SOI wafer, thus adding to the Z-height of the cavity 42, with the additional Z-height of the transducer 20 made up of the joined BCB layers 54,55.

To achieve smaller Z-dimension BCB heights, a greater percentage of thinner such as mesitylene may be used in the BCB layer 54,55 mixtures. It is also possible to achieve a thinner build up of BCB at lower spin deposition rpms, during spin coating, and with a corresponding less aggressive heating during semi-curing.

Following the mounting of the upper preform half 100 over the lower preform half 98, the silicon dioxide adhesive layer 126 is dissolved and the holder layer 124 is removed. Thereafter, the top silicon layer 84 may be laser ablated to the desired finish thickness to achieve the membrane diaphragm 44, and preferably to a thickness of between 0.1 to 5 nm, and which has flat uppermost surface.

After laser ablating, a chromium interface layer and the conductive gold layer 48 is optionally spin deposited photoplated onto the top surface of the silicon layer 84. Following plating, the adhesive layer 60 is next dissolved and holder piece 126 removed. The holder layers 120,124 may be removed by selectively dissolving the adhesive layers 122, 126 using $CF^4/H^2$, leaving the top silicon wafer 84 in place as the displaceable membrane 44.

To minimize the residual stress in the bonded wafers, and before removing the remaining part of the silicon substrate, the bonded wafers 80,84 are post annealed under pressure under the following annealing conditions:
Ramp to 150° C. in 60 min.
Stay 30 min at 150° C.
Ramp to 230° C.
Stay 60 min at 230° C.
Cool down to less than 150° C.

In one method, the conductive layer 48 is provided as a 100 nm thick gold layer which is deposited over the top of the membrane wafer 84. In an alternate construction, the gold layer which is spin deposited in place to achieve a desired top layer thickness.

Optionally, the fused wafer assembly is thereafter cut to a desired module 16 size having a desired number of individual transducers 20 (i.e. a 40×40 array). The conductive gold layer 48 provides electric conductivity from the frequency generator 70 to the metal deposit layer 50 formed on the sensor backing platform 18.

While a preferred use of the monitoring system 12 is provided in vehicle blind-spot monitoring, it is to be appreciated that its application is not limited thereto. Similarly, whilst the detailed description describes the capacitive micromachined ultrasonic transducer-based microarray modules 16 as being used in an automotive sensor 14, a variety of other applications will now be readily apparent. Such applications include without restriction, applications in the rail, marine and aircraft industries, as well as uses in association with various household applications, medical imaging, industrial and commercial environments and in consumer goods.

While the description describes various preferred embodiments of the invention, the invention is not restricted to the specific constructions and methods which are disclosed. Many modifications and variations will now occur to persons skilled in the art. For a definition of the invention, reference may be made to the appended claims.

We claim:

1. A method of forming a capacitive micromachined ultrasonic transducer (CMUT) for use in a microarray having a plurality of transducers, said method comprising,
   providing a first silicon-based wafer having a generally planar upper and lower surfaces,
   forming a first partially cured benzocyclobutene (BCB) layer over one of said upper or lower surfaces,
   providing a second silicon-based wafer as a device layer, said device layer having generally planar, parallel top and bottom surfaces, said device layer having thickness selected at between about 0.05 and 20 microns,
   forming a second partially cured benzocyclobutene (BCB) layer over one of said top or bottom surface of said device layer,
   etching a surface of one of said first and second BCB layers to form an etched surface having a plurality of pockets therein, each of said pockets having a preselected geometric shape, said pockets being characterized by respective sidewalls extending to a depth of between about 0.1 and 15 microns,
   aligning a portion of the etched surface of the BCB layer and the other of the first and second BCB layers in substantially juxtaposed contact, fully curing the first and second BCB layers to bond and said first wafer to said device layer with said bonded first and second BCB layers interposed therebetween, whereby said pockets form respective transducer air gaps.

2. The method as claimed in claim 1, wherein said step of forming said second BCB layer comprises spin coating BCB resin mixture on said second silicon-based wafer in a thickness selected at between about 0.01 and 10 microns to form a coated device layer, and heating said coated device layer to effect partial resin curing.

3. The method as claimed in claim 2, wherein said heating step comprises heating said coated device layer to a temperature less than about 200° C.

4. The method as claimed in claim 2, wherein said step of forming said first BCB layer comprises spin coating BCB resin mixture on said first silicon-based wafer to a thickness selected at between about 0.005 and 0.2 μm to form a coated silicon wafer, and heating said coated silicon wafer to a temperature of less than about 200° C. to maintain said resin mixture in a partially uncured state.

5. The method as claimed in claim 4, further comprising maintaining said BCB resin on said device layer and BCB layer on said coated silicon wafer partially cured prior to juxtaposed contact.

6. The method as claimed in claim 4, comprising etching said second BCB layer, and wherein prior to said step of etching said coated device layer is heated for a time selected to partially cure said BCB layer thereon to between about 30% to 70% of a fully cured state.

7. The method as claimed in claim 1, wherein said bonding step comprises while in juxtaposed contact, heating the first and second BCB layers at a temperature selected to fully cure BCB whereby the first BCB layer bonds with and fuses to said second BCB layer.

8. The method of as claimed in claim 6, wherein said step of etching comprises photo-plasma etching said second BCB layer.

9. The method as claimed in claim 7 further wherein, said bonding step is effected under vacuum conditions, and after bonding, physically sectioning the bonded first wafer and the device layer into individual microarrays, said microarrays comprising a square matrix of nine-by-nine transducers or greater.

10. The method as claimed in claim 9, further comprising applying a conductive metal layer to at least part of at least one of said top surface of said device layer or the lower surface of said first silicon-based wafer, said metal being selected from the group consisting of gold, silver and copper, wherein said conductive metal layer has a thickness selected at between about 1 and 500 nanometers.

11. The method as claimed in claim 10, wherein said geometric shape comprises a generally square shape having width and length lateral dimensions selected at between about 20 to 30 microns.

12. The method as claimed in claim 7, further wherein during alignment of the first and second BCB layers in juxtaposed contact, maintaining said first wafer and said device layer under a vacuum condition.

13. The method as claimed in claim 1, wherein said step of fully curing comprises heating said first and second BCB layers to a temperature of at least 210° C., and while fully curing, maintaining said first wafer and said device layer under said vacuum condition.

14. The method as a claimed in claim 1, wherein said step of forming said pockets comprises forming said pockets in a generally square matrix, wherein groupings of said pockets are aligned in a plurality parallel rows and/or columns.

15. The method of any one of claim 2, wherein said BCB resin mixture comprise BCB thinned with Mesitylene in about a 2:1 ratio and said step of spin coating said BCB resin mixture on said second silicon-based wafer comprises spin coating a mixture of BCB to the upper surface of the first wafer with a thickness of between about 1 and 5 microns.

16. The method as claimed in claim 1, wherein prior to forming said second BCB layer, applying an adhesion promoter coating to at least one of said top surface and said bottom surface onto which said second BCB layer is to be formed, said adhesion promoter coating having a thickness selected at less than about 200 nm.

17. A method of forming a capacitive micromachined transducer for use in a microarray comprising a plurality of transducers, said method comprising,
   providing a silicon backing wafer having generally planar, parallel front and rear surfaces, said backing wafer having a thickness selected at between about 5 and 100 microns,
   forming a first partially cured benzocyclobutene (BCB) layer over said front surface, said first BCB layer having a thickness selected at less than about 15 microns,
   providing a device layer having generally planar, parallel opposing forward and rearward surfaces, said device layer having a thickness selected at between about 0.05 and 15 microns, forming a second partially cured BCB structural layer over a rearward surface of said device layer, said BCB structural layer having a thickness selected at between about 1 and 15 microns, photo-plasma etching said second partially cured BCB structural layer to form a plurality of pockets therein, said pockets being characterized by a respective sidewall extending generally normal to said rearward surface and extending to a depth of between about 0.1 and 10 microns, with the first BCB layer and second BCB layer in juxtaposed contact, fully curing the first BCB layer and second BCB layer to bond the front surface of the silicon backing wafer in general alignment with the rearward surface of the device layer and substantially seal each pocket as a respective transducers air gap, and wherein said device layer is bonded relative to the silicon backing wafer with the bonded first BCB layer and second BCB layers as a structural and adhesive component, applying a conductive metal layer to at least part of at least one of the rear surface of the silicon backing wafer and the forward surface of the device layer.

18. The method as claimed in claim 17, wherein said device layer comprises a silicon based device layer.

19. The method as claimed in claim 17, wherein said step of forming the first BCB layer comprises spin coating a BCB resin mixture comprising BCB resin mixed with a thinner on said front surface, and after spin coating, partially curing said first BCB layer at a temperature less than about 200° C. to partially cure said BCB resin to between about a 30% to 70% fully cured state.

20. The method as claimed in claim 19, wherein said step of forming said second BCB layer comprises spin coating a BCB resin mixture comprising BCB resin on said rearward surface, and prior to said step of etching, heating said second BCB layer to a temperature selected to partially cure said BCB resin to between about 30% to 70%, and preferably about 50%, of a fully cured state.

21. The method as claimed in claim 17, wherein said bonding step comprises heating the first BCB layer and second BCB layer while in juxtaposed contact at a temperature selected to fully cure BCB resin, such that wherein the first BCB layer bonds with said second BCB layer.

22. The method as claimed in claim 21, further comprising while moving first BCB layer and second BCB layers into juxtaposed contact, maintaining said silicon backing wafer and said device layer under a vacuum condition.

23. The method as claimed in claim 22, wherein during fully curing, maintaining said silicon backing wafer and said device layer under said vacuum condition.

24. The method as claimed in claim 17, further comprising applying a the conductive metal coating to at least part of said forward surface of said device layer or the rear surface of said silicon backing wafer, said metal coating being selected from the group consisting of gold, silver, copper, and their alloys, and wherein said conductive metal layer has a thickness selected at between about 1 and 500 nanometers.

25. The method as claimed in claim 17, wherein said pockets are formed having a substantially common geometric shape having an average lateral dimension selected at between about 5 and 100 microns, and preferably 25 to 20 microns.

* * * * *